US012716832B2

(12) United States Patent
Lee et al.

(10) Patent No.: US 12,716,832 B2
(45) Date of Patent: Aug. 25, 2026

(54) NON-DESTRUCTIVE INSPECTION METHOD INCLUDING INSPECTING MULTIPLE OBSERVATION SITES AND METHOD OF MANUFACTURING SEMICONDUCTOR MEMORY DEVICE USING THE SAME

(71) Applicant: SAMSUNG ELECTRONICS CO., LTD., Suwon-si (KR)

(72) Inventors: Donghyun Lee, Suwon-si (KR); Sungyoon Ryu, Suwon-si (KR); Sooseok Lee, Suwon-si (KR); Younghoon Sohn, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 769 days.

(21) Appl. No.: 18/097,924

(22) Filed: Jan. 17, 2023

(65) Prior Publication Data

US 2023/0384212 A1 Nov. 30, 2023

(30) Foreign Application Priority Data

May 27, 2022 (KR) ........................ 10-2022-0065290

(51) Int. Cl.
*G01N 21/17* (2006.01)
*G01N 21/95* (2006.01)
(Continued)

(52) U.S. Cl.
CPC ..... *G01N 21/1702* (2013.01); *G01N 21/9501* (2013.01); *H10B 43/27* (2023.02);
(Continued)

(58) Field of Classification Search
CPC ........... G01N 21/1702; G01N 21/9501; G01N 2021/1706; G01N 2291/2697;
(Continued)

(56) References Cited

U.S. PATENT DOCUMENTS 8,312,772 B2 11/2012 Tas et al.
9,041,931 B2 5/2015 Colgan et al.
(Continued)

FOREIGN PATENT DOCUMENTS

JP 8-105736 A 4/1996
JP 2010-164403 A 7/2010
(Continued)

OTHER PUBLICATIONS

J. Dai et al., "Full Metrology Solutions for Advanced RF with Picosecond Ultrasonic Metrology", China Semiconductor Technology International Conference (CSTIC), DOI: 10.1109/CSTIC49141.2020.9282571, Jun. 26, 2020, (4 pages total).
(Continued)

*Primary Examiner* — Hwa Andrew Lee
(74) *Attorney, Agent, or Firm* — Sughrue Mion, PLLC

(57) ABSTRACT

An inspection method is provided. The inspection method includes inspecting a plurality of first observation sites by detecting ultrasonic signals emitted from the plurality of first observation sites, inspecting a plurality of second observation sites by detecting ultrasonic signals emitted from the plurality of second observation sites; and inspecting a target structure by detecting an ultrasonic signal emitted from the target structure, where the target structure includes a structure of interest, and wherein the plurality of first observation sites are intermediate results of forming the target structure, respectively, and the plurality of second observation sites are structures modified from the target structure.

11 Claims, 31 Drawing Sheets

(51) Int. Cl.

| | |
|---|---|
| ***H10B 43/27*** | (2023.01) |
| ***H10P 74/00*** | (2026.01) |
| ***H10P 74/20*** | (2026.01) |

(52) U.S. Cl.

CPC ............ *H10P 74/203* (2026.01); *H10P 74/27* (2026.01); *G01N 2021/1706* (2013.01)

(58) Field of Classification Search

CPC .... G01N 29/2418; G01N 29/36; G01N 29/46; G01N 29/04; G01N 29/42; G01N 29/44; G01N 2291/02854; G01N 2291/0289; H01L 22/12; H01L 22/30; H01L 22/10; H10B 43/27

See application file for complete search history.

(56) References Cited

U.S. PATENT DOCUMENTS

| | | | |
|---|---|---|---|
| 9,576,862 | B2 | 2/2017 | Murray et al. |
| 9,587,932 | B2 | 3/2017 | Marx et al. |
| 9,991,176 | B2 | 6/2018 | Mehendale et al. |
| 10,354,372 | B2 | 7/2019 | Sakai et al. |

FOREIGN PATENT DOCUMENTS

| | | | | |
|---|---|---|---|---|
| JP | 10-1614992 | A | 4/2016 | |
| JP | 6797646 | B2 | 12/2020 | |
| KR | 10-1455777 | A | 10/2014 | |
| WO | WO-2022143102 | A1 * | 7/2022 | ............ G01N 27/00 |

OTHER PUBLICATIONS

M. Mehendale et al., “Acoustic Metrology for Fine Pitch Microbumps in 3DIC”, 30th Annual SEMI Advanced Semiconductor Manufacturing Conference (ASMC), DOI: 10.1109/ASMC.2019.8791757, May 6, 2019, (6 total pages).

* cited by examiner

FIG. 6
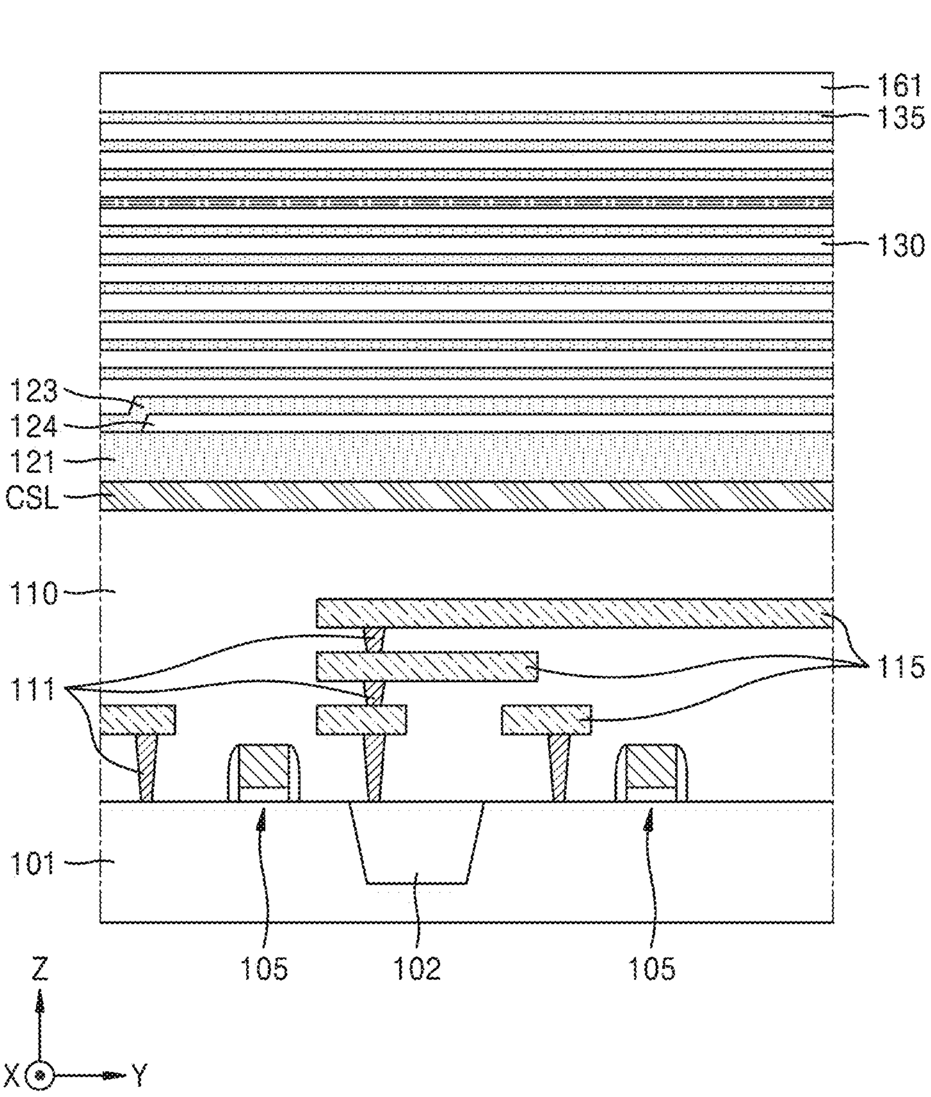
OS1_4
161
135
130
123
124
121
CSL
110
111
115
101
105
102
105
Z
X
Y

NON-DESTRUCTIVE INSPECTION METHOD INCLUDING INSPECTING MULTIPLE OBSERVATION SITES AND METHOD OF MANUFACTURING SEMICONDUCTOR MEMORY DEVICE USING THE SAME

CROSS-REFERENCE TO THE RELATED APPLICATIONS

This application is based on and claims priority under 35 U.S.C. § 119 to Korean Patent Application No. 10-2022-0065290, filed on May 27, 2022, in the Korean Intellectual Property Office, the disclosure of which is incorporated by reference herein in its entirety.

BACKGROUND

The present disclosure relates to an inspection method and a method of manufacturing a semiconductor memory device by using the same.

As miniaturization, multi-functionality, and high performance of electronic products are demanded, high-capacity semiconductor memory devices are demanded. Since the degree of integration of a two-dimensional semiconductor memory device mainly depends on the reduction of the area occupied by a unit memory cell, the degree of integration of a semiconductor device is increasing.

Therefore, a method of monitoring each semiconductor manufacturing process step is demanded, and, to this end, a high-speed non-destructive inspection is essential. Recently, as solutions therefor, research is being conducted into an optoacoustic inspection and an ultrasonic inspection.

SUMMARY

Example embodiments of the present disclosure provide an inspection method with improved reliability and a method of manufacturing a semiconductor memory device by using the same.

According to an aspect of an example embodiment, an inspection method includes: inspecting first observation sites by detecting ultrasonic signals emitted from the first observation sites; inspecting second observation sites by detecting ultrasonic signals emitted from the second observation sites; and inspecting a target structure by detecting an ultrasonic signal emitted from the target structure, the target structure including a structure of interest, wherein the first observation sites are intermediate results of forming the target structure, respectively, and the second observation sites are structures modified from the target structure.

According to an aspect of an example embodiment, a method of manufacturing a semiconductor device includes: forming a first process observation site by forming a peripheral circuit on a substrate; forming a second process observation site by forming a conductive plate on the peripheral circuit; forming a third process observation site by forming a first semiconductor layer, a lower sacrificial layer, and a third semiconductor layer on the conductive plate; forming a fourth process observation site by alternately stacking a plurality of insulation layers and a plurality of sacrificial layers on the third semiconductor layer; forming a fifth process observation site by forming a string select line cut that horizontally separates some of the plurality of sacrificial layers; inspecting at least some from among the first, second, third, fourth, and fifth process observation sites; forming a target structure by etching the plurality of insulation layers and the plurality of sacrificial layers to form a plurality of channel holes; and inspecting the target structure, wherein the inspecting the at least some from among the first, second, third, fourth, and fifth process observation sites and the inspecting of the target structure is performed by any one from among an optoacoustic inspection and an ultrasonic inspection.

According to an aspect of an example embodiment, a method of manufacturing a semiconductor device includes: forming a first process observation site by forming a peripheral circuit on a substrate; inspecting the first process observation site; forming a second process observation site by forming a conductive plate on the peripheral circuit; inspecting the second process observation site; forming a third process observation site by forming a first semiconductor layer, a lower sacrificial layer, and a third semiconductor layer on the conductive plate; inspecting the third process observation site; forming a fourth process observation site by alternately stacking a plurality of insulation layers and a plurality of sacrificial layers on the third semiconductor layer and forming a first upper insulation layer; inspecting the fourth process observation site; forming a fifth process observation site by forming a string select line cut that horizontally separates some of the plurality of sacrificial layers; inspecting the fifth process observation site; forming a sixth process observation site by etching the plurality of insulation layers and the plurality of sacrificial layers to form a plurality of channel holes; inspecting the sixth process observation site; forming a seventh process observation site by forming a plurality of channel structures filling the plurality of channel holes, respectively; inspecting the seventh process observation site; forming an eighth process observation site by forming a second upper insulation layer covering the plurality of channel structures; inspecting the eighth process observation site; forming a target structure by etching the plurality of insulation layers and the plurality of sacrificial layers to form a plurality of word line cuts; and inspecting the target structure, wherein each of the inspecting of the first process observation site, the inspecting of the second process observation site, the inspecting of the third process observation site, the inspecting of the fourth process observation site, the inspecting of the fifth process observation site, the inspecting of the third process observation site, the inspecting of the sixth process observation site, the inspecting of the seventh process observation site, and the inspecting of the eighth process observation site is performed by any one from among an optoacoustic inspection and an ultrasonic inspection.

BRIEF DESCRIPTION OF THE DRAWINGS

Embodiments of the present disclosure will be more clearly understood from the following detailed description taken in conjunction with the accompanying drawings, in which:

FIGS. 3 to 8 are cross-sectional views for describing a method of manufacturing a semiconductor device, according to example embodiments;

DETAILED DESCRIPTION

Hereinafter, non-limiting example embodiments of the present disclosure are described with reference to drawings.

Figure 1:
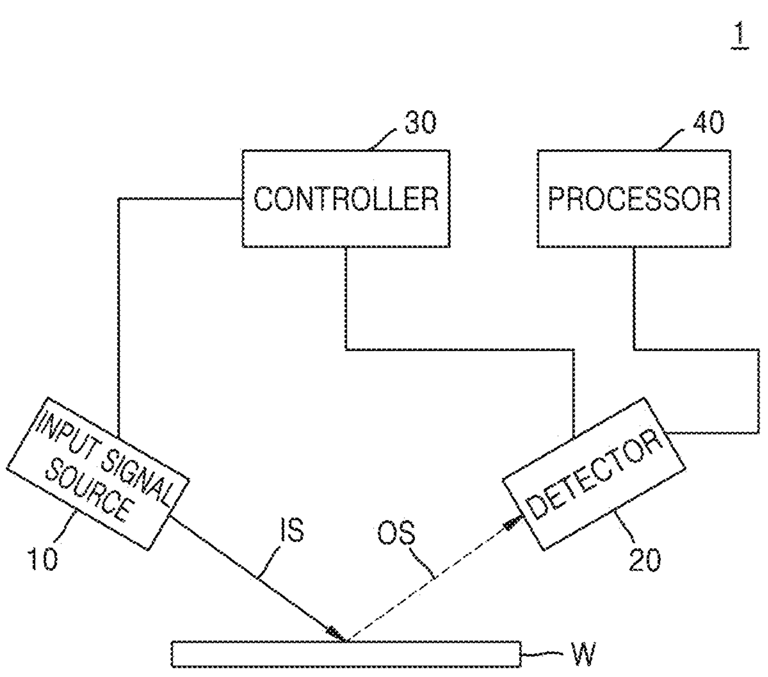
FIG. 1 is a schematic diagram for describing a measurement system according to example embodiments.

FIG. 1 is a schematic diagram for describing a measurement system 1 according to example embodiments.

Referring to FIG. 1, according to example embodiments, the measurement system 1 may be configured to inspect an inspection target such as, for example, a wafer W. According to example embodiments, the measurement system 1 may non-destructively inspect an inspection target (e.g., the wafer W). The measurement system 1 may perform any one of an optoacoustic inspection and an ultrasonic inspection.

Here, in an optoacoustic inspection, an optical signal is applied to an inspection target (e.g., the wafer W), and an acoustic signal generated by the inspection target (e.g., the wafer W) in response to the optical signal is sensed. A portion of the inspection target (e.g., the wafer W) that has absorbed an optical signal expands due to a rise in temperature. In this case, the optical signal is a pulse or a pulse train, and the length of each pulse may need to be shorter than the characteristic time of thermal diffusion induced by the optical signal. The constraint is called thermal confinement. A pressure wave is generated through rapid expansion of a portion of the wafer W due to the absorption of the optical signal, and, as a result, an acoustic signal in the ultrasonic frequency band may be generated. By sensing the acoustic signal generated from the portion of the wafer W, the wafer W may be inspected.

Here, in an ultrasonic inspection, an optical signal is applied to an inspection target (e.g., the wafer W), and an ultrasonic signal generated by the inspection target (e.g., the wafer W) in response to the optical signal is sensed.

When the measurement system 1 performs an optoacoustic inspection, an input signal IS may be an optical signal, and an output signal OS may be an ultrasonic signal. When the measurement system 1 performs an ultrasonic inspection, the input signal IS and the output signal OS may be ultrasound signals.

The measurement system 1 may include an input signal source 10, a detector 20, a controller 30, and a processor 40.

The input signal source 10 may generate the input signal IS, which is either an optical signal or an ultrasonic signal. The input signal source 10 may irradiate the input signal IS to an inspection target (e.g., the wafer W).

The input signal IS may be an optical signal or an ultrasonic signal. As a non-limiting example, the input signal source 10 may include, for example, an Nd:YAG laser oscillator, and the wavelength of the input signal IS may be about 1064 nm. When the input signal IS is an ultrasonic signal, the frequency of the input signal IS may be within a range from several MHz to dozens of MHz.

The input signal source 10 may include any one of a photonic integrated circuit, fiber optics, and free space optics.

The detector 20 may be configured to generate an electrical signal in response to the output signal OS. The detector 20 may measure signals within a frequency band from several MHz to dozens of MHz.

The controller 30 may be configured to control the operations of the input signal source 10 and the detector 20. The controller 30 may be configured to generate a signal for controlling oscillation of the input signal source 10 and turning on/off of the detector 20.

The processor 40 may be configured to process electrical signals obtained by the detector 20. For example, the processor 40 may be configured to pre-processes measurement data including electrical signals obtained by the detector 20, convert pre-processed data, calculate constructive interference periods of respective inspection targets, filter frequencies of observation sites and transformed data regarding the inspection targets, and perform calculations between the observation sites and filtered data regarding the inspection targets.

According to example embodiments, the controller 30 and the processor 40 may be implemented in hardware, firmware, software, or any combination thereof. For example, the controller 30 and the processor 40 may include computing devices such as workstation computers, desktop computers, laptop computers, and tablet computers. The controller 30 and the processor 40 may include a simple controller, a complex processor such as a microprocessor, a central processing unit (CPU), and a graphics processing unit (GPU), a processor configured by software, dedicated hardware, or firmware. The controller 30 and the processor 40 may be implemented by, for example, a general-purpose computer or application-specific hardware such as a digital signal processor (DSP), a field programmable gate array (FPGA), and an application specific integrated circuit (ASIC).

According to some embodiments, the operations of the controller 30 and the processor 40 may be implemented as instructions stored on a machine-readable medium that may be read and executed by one or more processors. Here, a machine-readable medium may include any mechanism for storing and/or transmitting information in a form readable by a machine (e.g., a computing device). For example, machine-readable media may include read-only memories (ROM), random access memories (RAM), magnetic disk storage media, optical storage media, and flash memory devices, and may have recorded thereon electrical, optical, acoustic, or other forms of radio frequency signals (e.g., carrier waves, infrared signals, digital signals, etc.) and any other signal.

Firmware, software, routines, and instructions may also be configured to perform the operations described for the controller 30 and the processor 40, or any of processes described below. However, it is merely for convenience of explanation, and the operations described above of the controller 30 and the processor 40 may be performed by computing devices, processors, or other devices executing firmware, software, routines, and instructions.

Figure 2A:
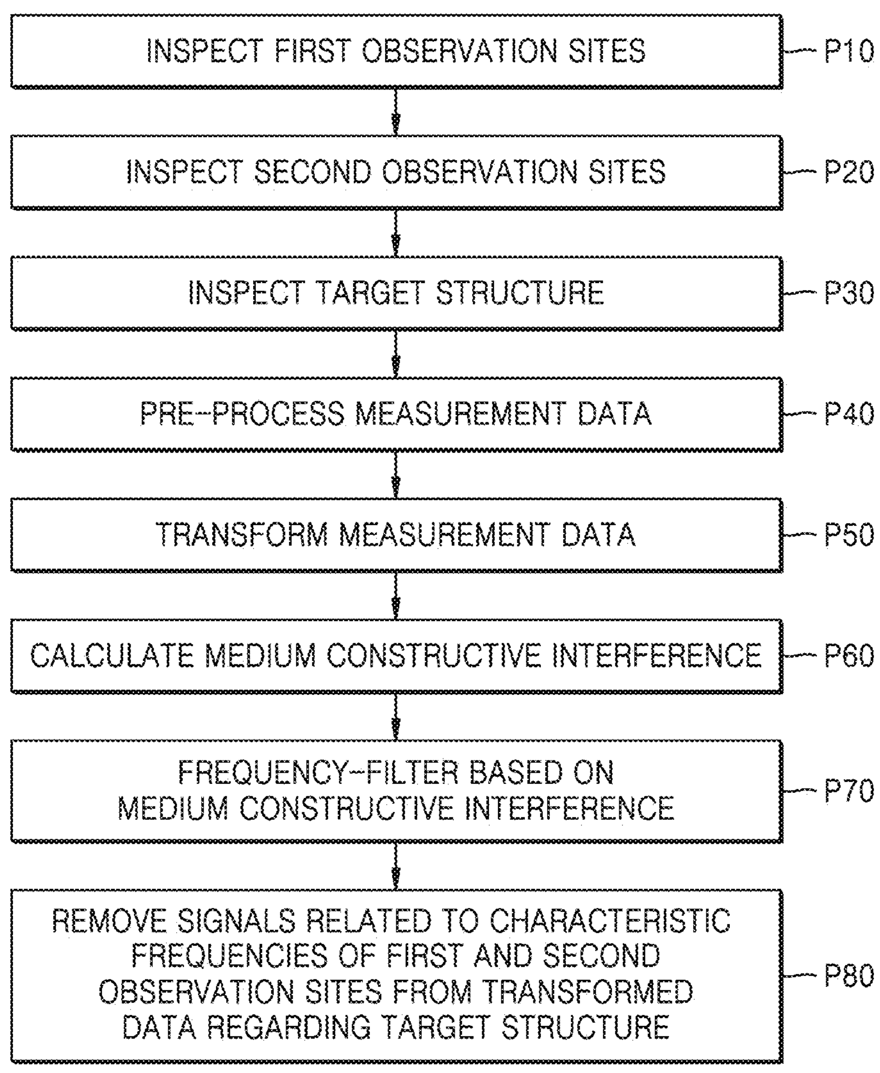
FIG. 2A is a flowchart of a method of manufacturing a semiconductor device, according to example embodiments.

FIG. 2A is a flowchart of a method of manufacturing a semiconductor device, according to example embodiments.

Referring to FIG. 2A, in operation P10, first observation sites may be inspected.

The first observation sites may be results of a series of processes for implementing a target structure, respectively. According to example embodiments, a target structure may be obtained by performing a series of processes with respect to the first observation sites, respectively. In other words, first observation sites may be intermediate results of a method of manufacturing a semiconductor device for forming a target structure. Each of the first observation sites may not include an element of interest. Each of the first observation sites may include adjacent elements of an element of interest.

Here, an element of interest may be a key monitoring target in semiconductor manufacturing to be identified through inspection. Adjacent elements of an element of interest refer to elements that are arranged adjacent to the element of interest and already formed before formation of the element of interest in a process sequence.

Figure 7:
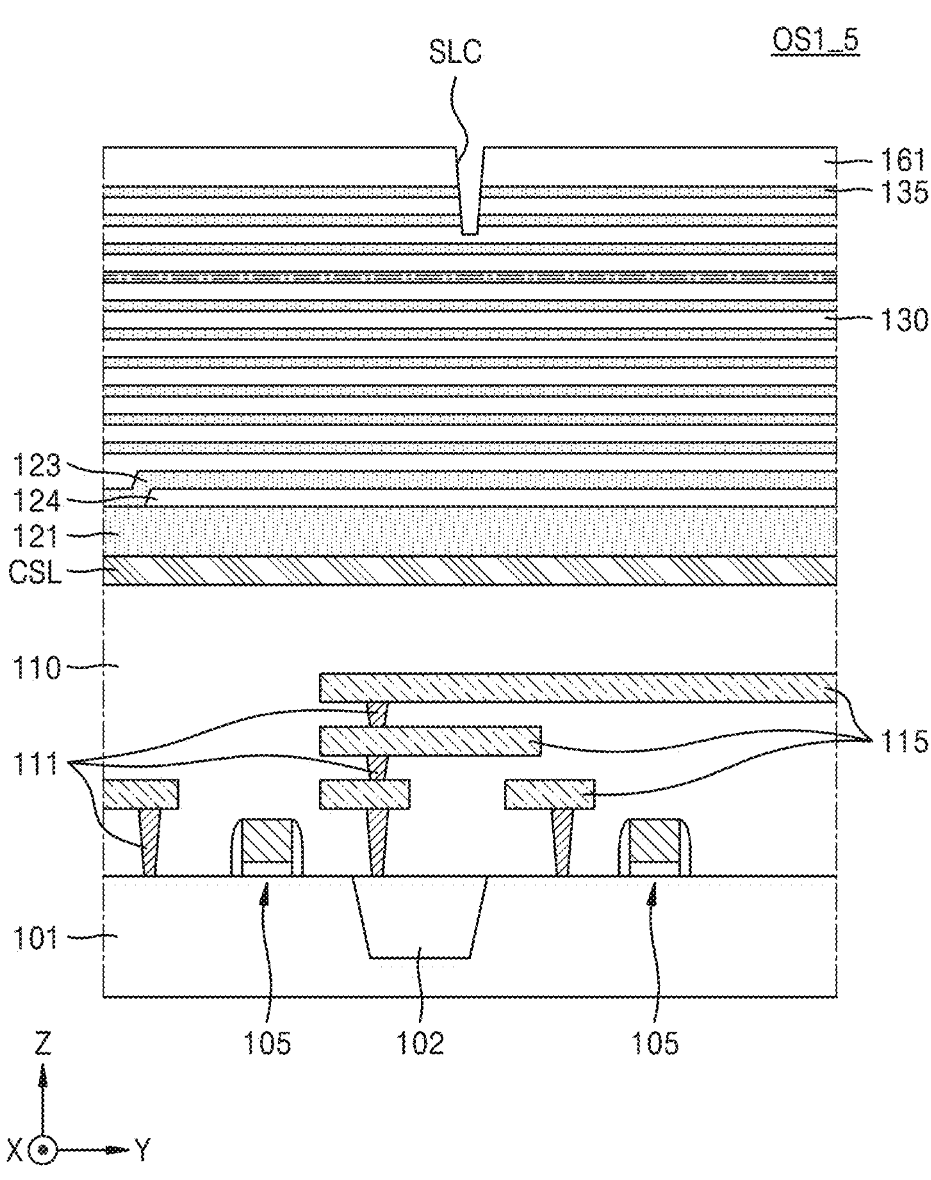
Figure 8:
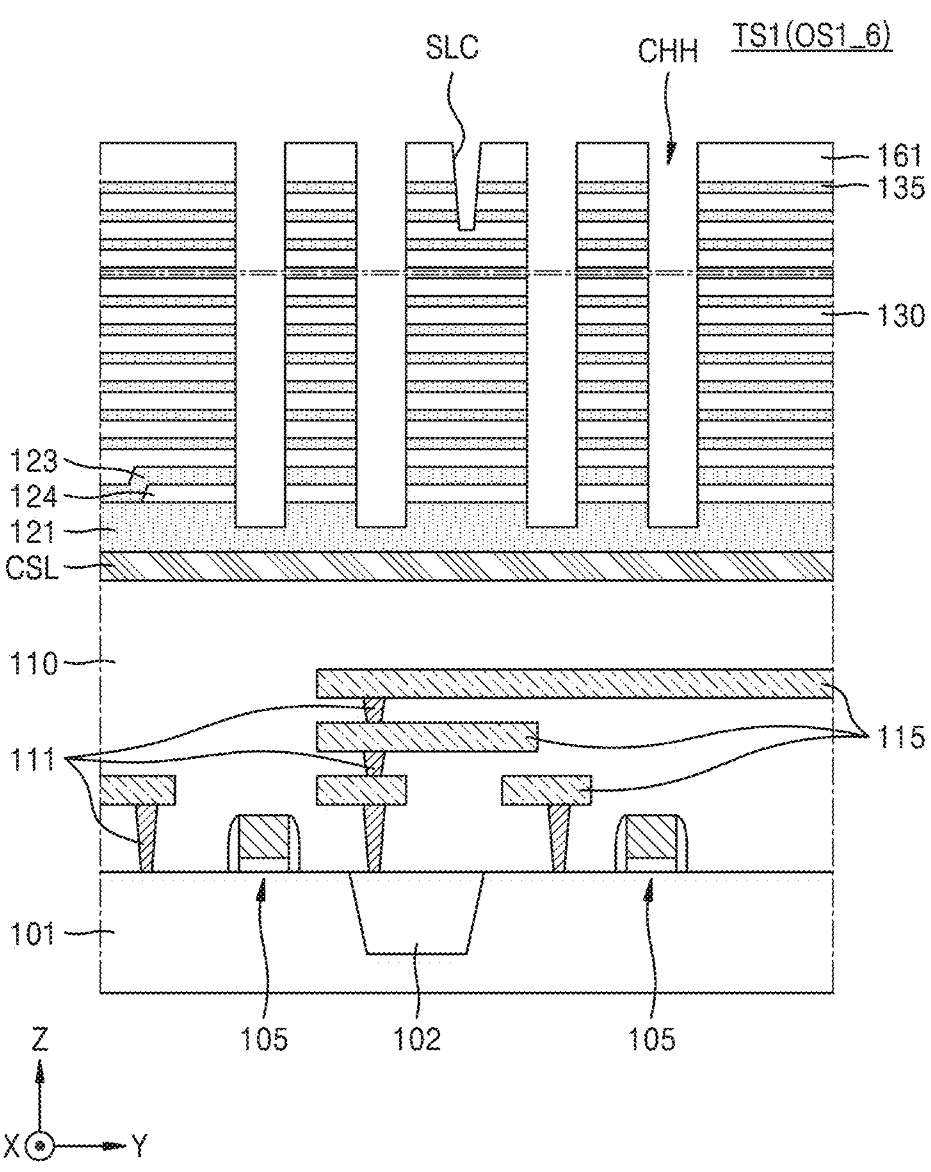

For example, in the case of a target structure TS1 of FIG. 8, each of intermediate results shown in FIGS. 3 to 7 may include first observation sites OS1_1, OS1_2, OS1_3, OS1_4, and OS1_5. In another example, in the case of a target structure TS2 of FIG. 14, each of the intermediate results shown in FIGS. 3 to 8, 12, and 13 may include first observation sites OS1_1, OS1_2, OS1_3, OS1_4, OS1_5, OS1_6, OS1_7, and OS1_8.

The first observation sites OS1_1, OS1_2, OS1_3, OS1_4, OS1_5, OS1_6, OS1_7, and OS1_8 may also be sequentially referred to as first to eighth process observation structures.

For example, in a target structure TS1 of FIG. 8, a plurality of channel holes CHH may be an element of interest, and the first observation sites OS1_1, OS1_2, OS1_3, OS1_4, and OS1_5 of FIGS. 3 to 7 may not include the plurality of channel holes CHH, which is an element of interest. The first observation sites OS1_1, OS1_2, OS1_3, OS1_4, and OS1_5 of FIGS. 3 to 7 may include at least some of adjacent elements of the plurality of channel holes CHH of FIG. 8, that is, a device isolation layer 102, peripheral transistors 105, peripheral circuit wires including conductive vias 111 and conductive patterns 115, a lower insulation layer 110 covering the peripheral circuit wires, a conductive plate CSL, a first semiconductor layer 121, a third semiconductor layer 123, a lower sacrificial layer 124, a plurality of insulation layers 130, a plurality of sacrificial layers 135, and a first upper insulation layer 161.

Figure 12:
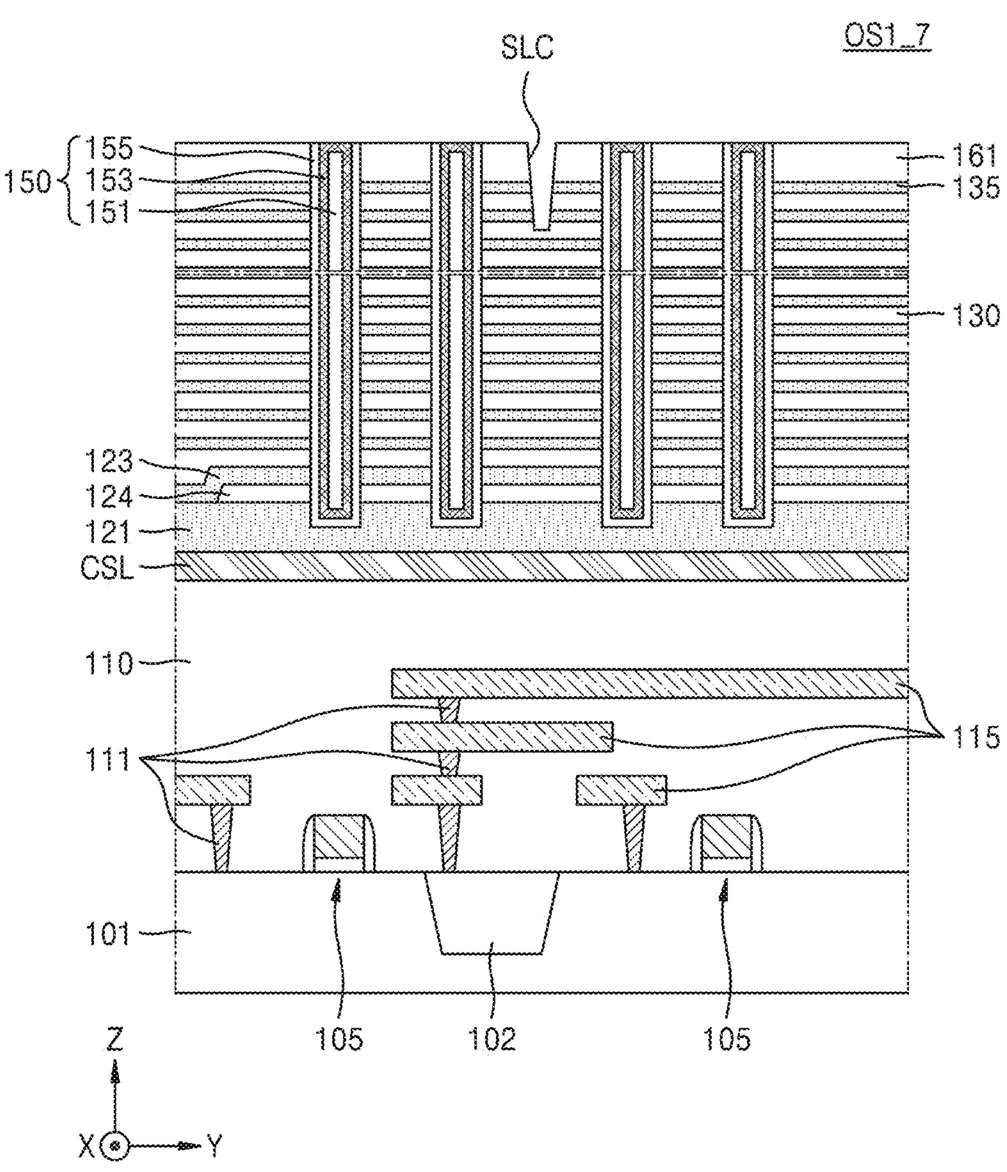
FIGS. 12 to 19 are cross-sectional views for describing a method of manufacturing a semiconductor device, according to example embodiments.
Figure 13:
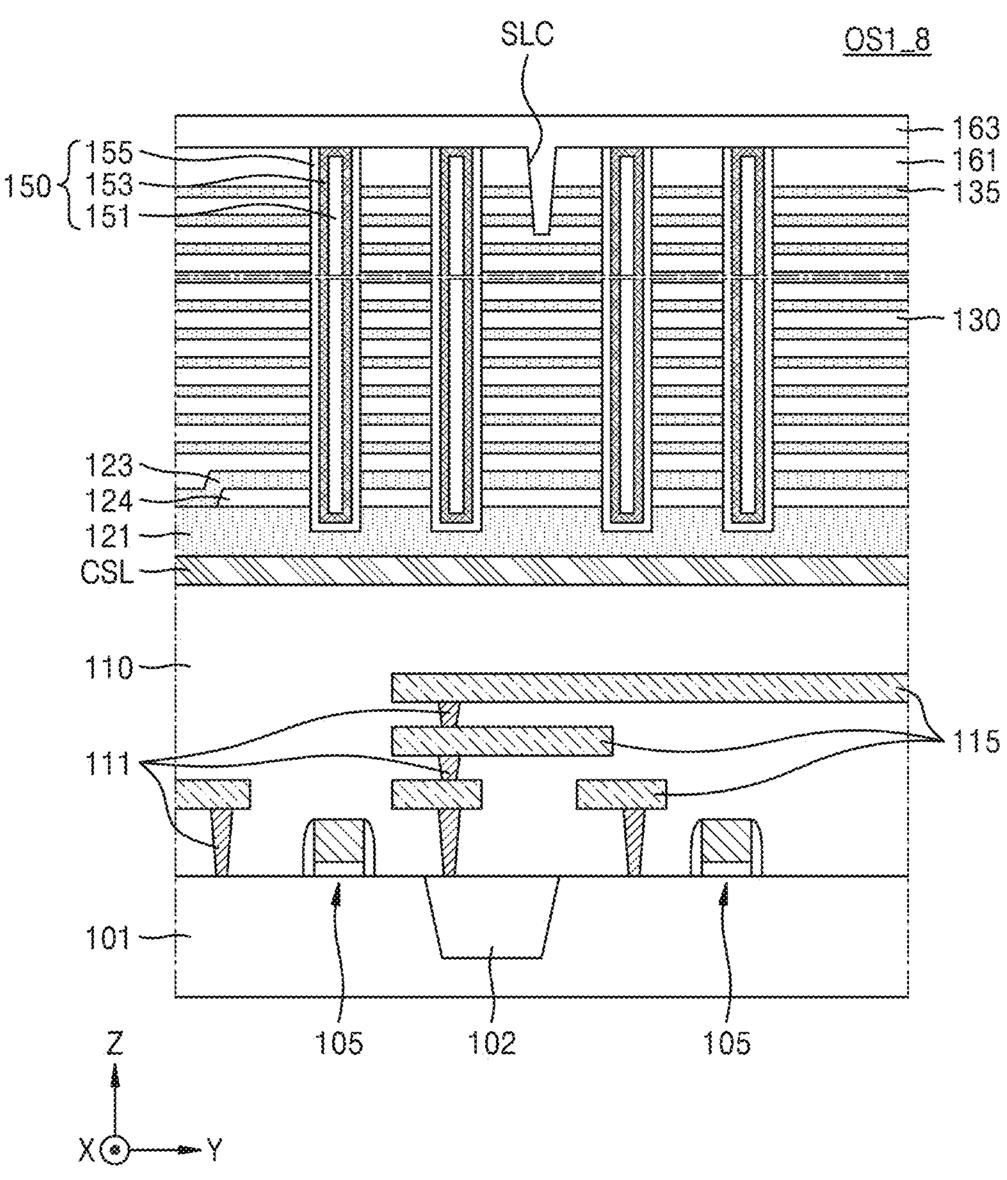
Figure 14:
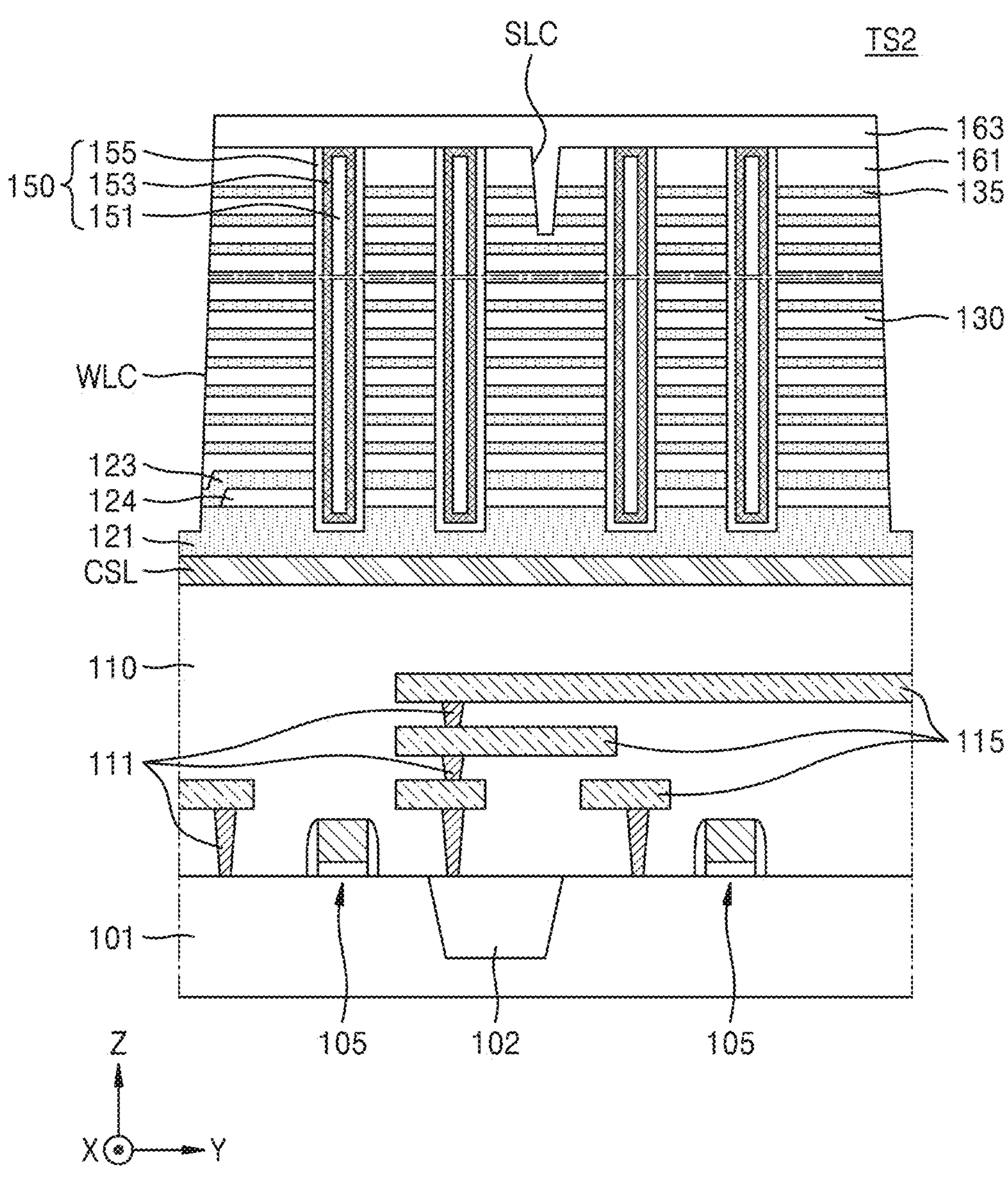

In another example, in the target structure TS2 of FIG. 14, a plurality of word line cuts WLC may be an element of interest, and first observation sites OS_1, OS1_2, OS1_3, OS1_4, OS1_5, OS1_6, OS1_7, and OS1_8 of FIGS. 3 to 8, 12, and 13 may not include the plurality of word line cuts WLC, which is an element of interest. The first observation sites OS1_1, OS1_2, OS1_3, OS1_4, OS1_5, OS1_6, OS1_7, and OS1_8 of FIGS. 3 to 8, 12, and 13 may include at least some of adjacent elements of the plurality of word line cuts WLC of FIG. 14, that is, the device isolation layer 102, the peripheral transistors 105, the peripheral circuit wires including the conductive vias 111 and the conductive patterns 115, the lower insulation layer 110 covering the peripheral circuit wires, the conductive plate CSL, the first semiconductor layer 121, the third semiconductor layer 123, the lower sacrificial layer 124, the plurality of insulation layers 130, the plurality of sacrificial layers 135, the first upper insulation layer 161, and a second upper insulation layer 163.

Figure 2B:
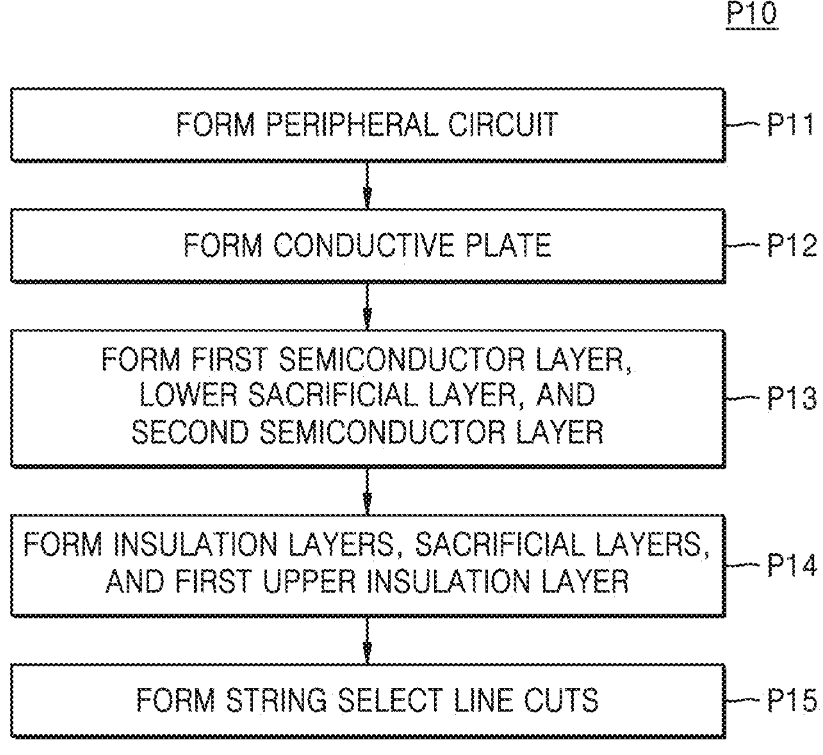
FIG. 2B is a flowchart for describing an operation of FIG. 2.

FIG. 2B is a flowchart for describing operation P10 of FIG. 2. Operation P10 may include operations P11 to P15, as described below.

FIGS. 3 to 16 are cross-sectional views for describing a method of manufacturing a semiconductor device, according to example embodiments.

Figure 3:
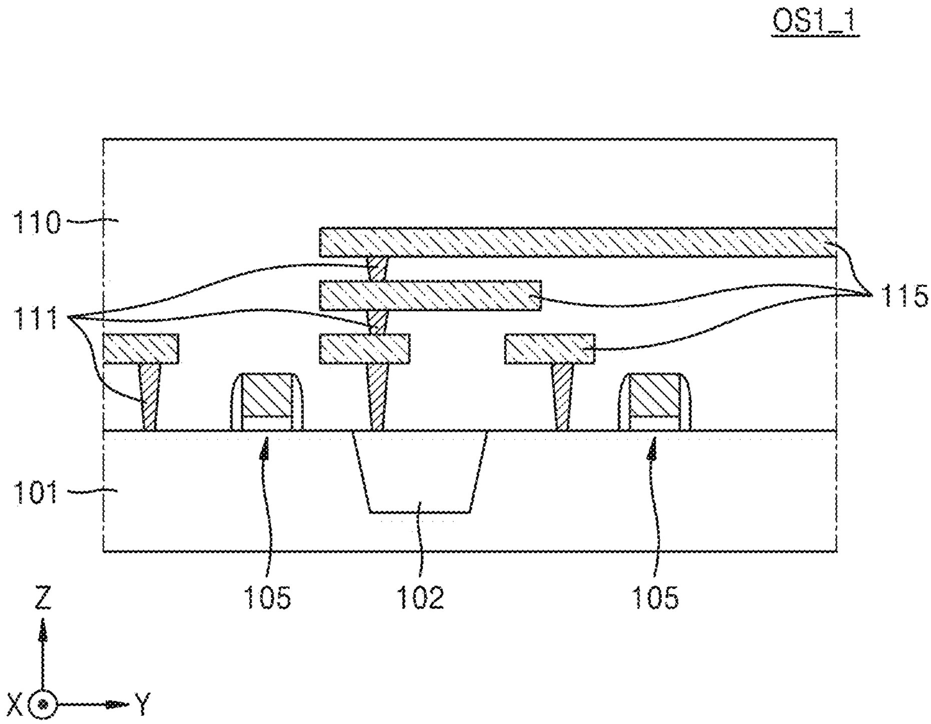

Referring to FIGS. 2B and 3, in operation P11, a peripheral circuit may be formed on a substrate 101. Therefore, a first observation site OS1_1 may be formed.

The formation of the peripheral circuit may include defining the device isolation layer 102 on the substrate 101, forming the peripheral transistors 105, forming the peripheral circuit wires including the conductive vias 111 and the conductive patterns 115, and forming the lower insulation layer 110 covering the peripheral circuit wires.

The substrate 101 may be a semiconductor substrate including a semiconductor material such as monocrystalline silicon or monocrystalline germanium. The substrate 101 may further include, for example, a compound semiconductor such as silicon, germanium, or silicon-germanium.

According to example embodiments, the device isolation layer 102 may be formed by forming a shallow trench by etching a portion of the substrate 101 and depositing an insulating material in the shallow trench. An active region and a field region may be defined by the device isolation layer 102.

By performing an ion implantation process, a p-well region and an n-well region may be sequentially formed in the substrate 101, and the peripheral transistors 105 may be formed. The peripheral transistors 105 may constitute a decoder circuit, a page buffer, and a logic circuit.

Subsequently, by performing a metallization process, the peripheral wires including the conductive vias 111 and the conductive patterns 115 and the lower insulation layer 110 covering the peripheral wires may be formed.

After the first observation site OS1_1 is formed, an inspection on the first observation site OS1_1 may be performed. The inspection on the first observation site OS1_1 may be either the optoacoustic inspection or the ultrasonic inspection described with reference to FIG. 1.

Figure 4:
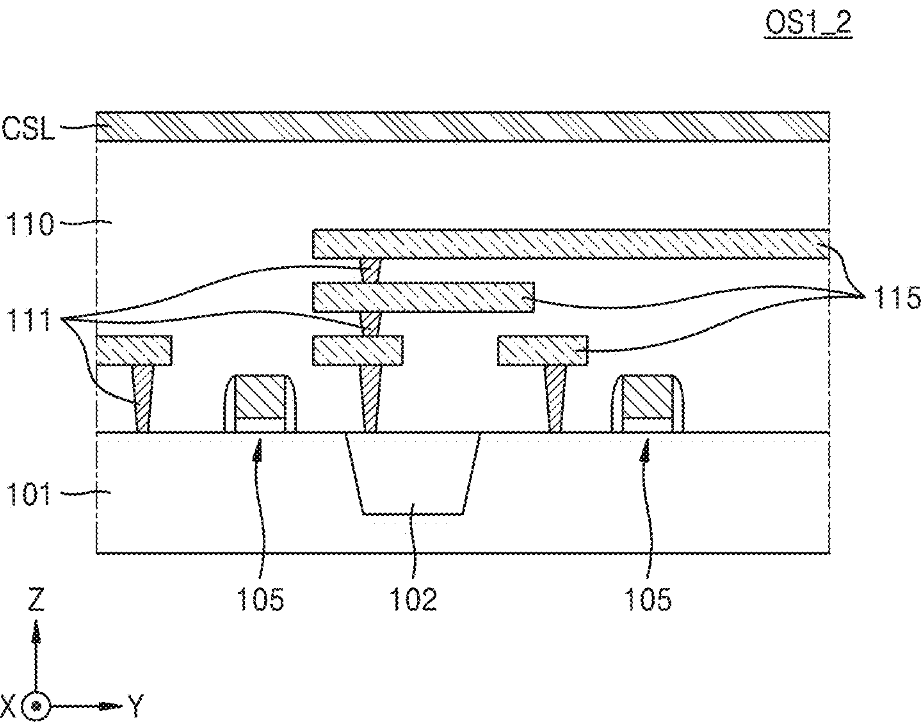

Referring to FIGS. 2B and 4, in operation P12, the conductive plate CSL may be formed on the lower insulation layer 110. Therefore, a first observation site OS1_2 may be formed.

The conductive plate CSL may include tungsten (W) or a W compound. The conductive plate CSL may be a common source line. The conductive plate CSL may be formed by chemical vapor deposition, atomic layer deposition, physical vapor deposition, etc.

After the first observation site OS1_2 is formed, an inspection on the first observation site OS1_2 may be performed. The inspection on the first observation site OS1_2 may be either the optoacoustic inspection or the ultrasonic inspection described with reference to FIG. 1.

Figure 5:
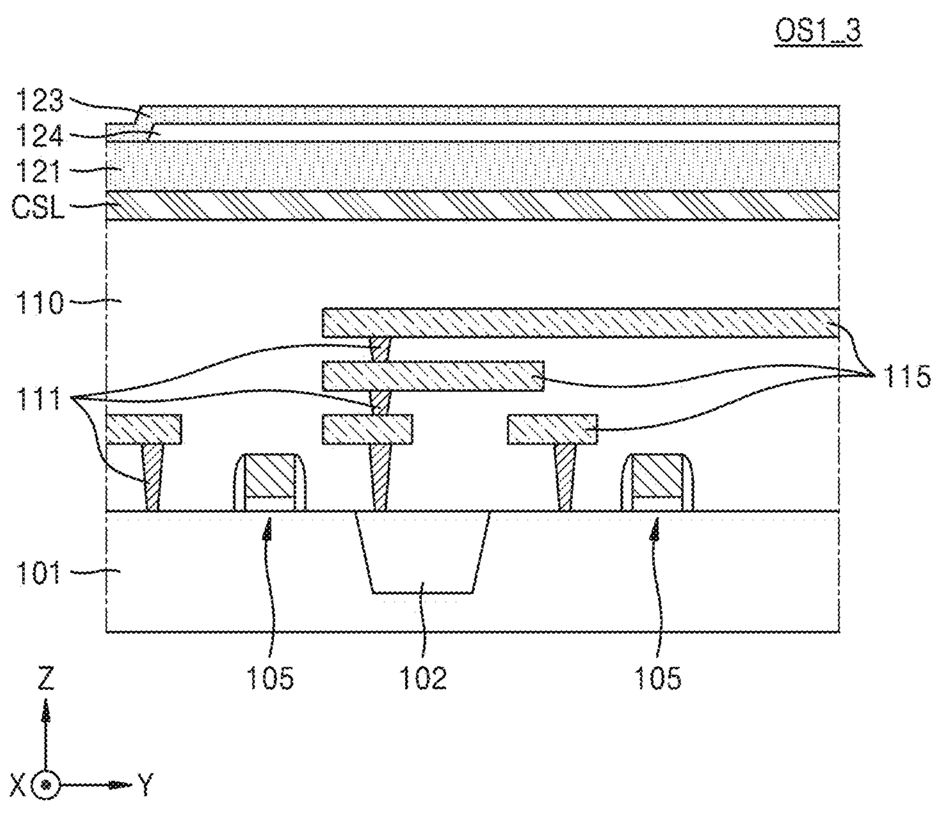

Referring to FIGS. 2B and 5, in operation P13, the first semiconductor layer 121, the lower sacrificial layer 124, and the third semiconductor layer 123 may be formed. Therefore, a first observation site OS1_3 may be formed.

The first semiconductor layer 121 and the third semiconductor layer 123 may each be formed by chemical vapor deposition, atomic layer deposition, physical vapor deposition, etc. The first semiconductor layer 121 and the third semiconductor layer 123 may include doped silicon.

After the lower sacrificial layer 124 is provided on the first semiconductor layer 121 and a portion of the lower sacrificial layer 124 is removed, the third semiconductor layer 123 may be conformally provided thereon. Therefore, the first semiconductor layer 121 and the third semiconductor layer 123 may contact each other at a location where the portion of the lower sacrificial layer 124 is removed. The lower sacrificial layer 124 may include any one of silicon oxide, silicon nitride, and silicon oxynitride. According to some embodiments, the lower sacrificial layer 124 may have a high etch selectivity with respect to the plurality of insulation layers 130 (refer to FIG. 6), as described below.

After the first observation site OS1_3 is formed, an inspection on the first observation site OS1_3 may be performed. The inspection on the first observation site OS1_3 may be either the optoacoustic inspection or the ultrasonic inspection described with reference to FIG. 1.

Referring to FIGS. 2B and 6, in operation P14, the plurality of insulation layers 130, the plurality of sacrificial layers 135, and the first upper insulation layer 161 may be formed. Therefore, a first observation site OS1_4 may be formed.

The plurality of sacrificial layers 135 and the plurality of insulation layers 130 may be alternately stacked over the third semiconductor layer 123. The number of stacks of the plurality of sacrificial layers 135 and the number of stacks of the plurality of insulation layers 130 may each be determined variously according to the specification of a memory device to be manufactured, e.g., 16 layers, 32 layers, 64 layers, 128 layers, 176 layers, 256 layers, etc.

According to some embodiments, the plurality of insulation layers 130 and the plurality of sacrificial layers 135 may include different materials. According to some embodiments, the plurality of insulation layers 130 and the plurality of sacrificial layers 135 may have high etch selectivity to each other. The plurality of insulation layers 130 and the plurality of sacrificial layers 135 may be formed, for example, in different chemical vapor deposition (CVD) facilities. For example, a result of FIG. 5 (i.e., the observation site OS1_3) may be processed alternately by a first CVD facility for forming the plurality of insulation layers 130 and a second CVD facility for forming the plurality of sacrificial layers 135.

For example, when the plurality of sacrificial layers 135 include silicon oxide, the plurality of insulation layers 130 may include silicon nitride. In another example, when the plurality of sacrificial layers 135 include silicon nitride, the plurality of insulation layers 130 may include silicon oxide. In another example, when the plurality of sacrificial layers 135 include undoped polysilicon, the plurality of insulation layers 130 may include silicon nitride or silicon oxide.

The first upper insulation layer 161 may be provided on the uppermost one of the sacrificial layers 135. The first upper insulation layer 161, the second upper insulation layer 163, and a third upper insulation layer 165 (refer to FIG. 18), which are to be described below, may include, for example, an insulating material such as silicon oxide.

After the first observation site OS1_4 is formed, an inspection on the first observation site OS1_4 may be performed. The inspection on the first observation site OS1_4 may be either the optoacoustic inspection or the ultrasonic inspection described with reference to FIG. 1.

Referring to FIGS. 2B and 7, in operation P15, a string select line cut SLC may be formed. Therefore, a first observation site OS1_5 may be formed.

According to some embodiments, the string select line cut SLC may be formed by anisotropically etching the first upper insulation layer 161, some of the plurality of insulation layers 130, and some of the plurality of sacrificial layers 135, such that two sacrificial layers 135 farthest away from the third semiconductor layer 123 are horizontally separated from each other.

After the first observation site OS1_5 is formed, an inspection on the first observation site OS1_5 may be performed. The inspection on the first observation site OS1_5 may be either the optoacoustic inspection or the ultrasonic inspection described with reference to FIG. 1.

Although an embodiment in which the first observation sites OS1_1, OS1_2, OS1_3, OS1_4, and OS1_5 of FIGS. 3 to 7 are each inspected by either an optoacoustic inspection or an ultrasonic inspection has been described above, it is merely an example and does not limit embodiments of the present disclosure in any sense. For example, each of additional observation sites may be inspected through either an optoacoustic inspection or an ultrasonic inspection or only some of the first observation sites OS1_1, OS1_2, OS1_3, OS1_4, and OS1_5 may be inspected.

Subsequently, referring to FIG. 8, the plurality of channel holes CHH may be formed. Therefore, the target structure TS1 may be formed.

An etching mask including an anti-reflection film, a hard mask film, and a photoresist film is formed, and, by anisotropically etching the first upper insulation layer 161, the plurality of insulation layers 130, the plurality of sacrificial layers 135, the first semiconductor layer 121, and the lower sacrificial layer 124 by using the etching mask, the plurality of channel holes CHH may be formed.

Subsequently, in operation P20, second observation sites may be inspected.

The second observation sites may be analogue structures of the target structure TS1. The second observation sites may be structures modified from the target structure TS1. The second observation sites may be structures obtained by omitting or replacing adjacent elements of an element of interest in the target structure TS1.

FIGS. 9A to 9K are cross-sectional views showing second observation sites of the target structure TS1 of FIG. 8.

Figure 9A:
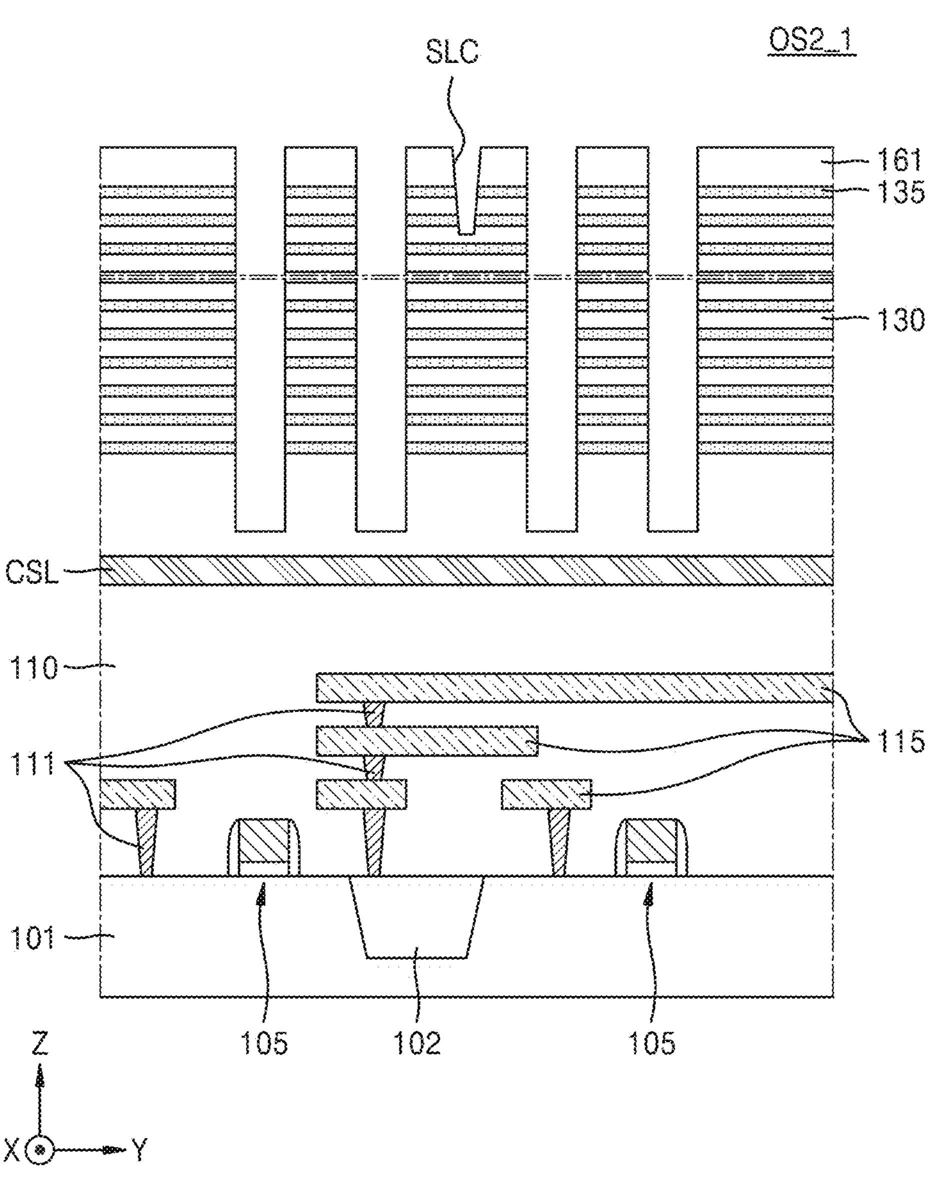
FIGS. 9A to 9K are cross-sectional views showing second observation sites of a target structure of FIG. 8.
Figure 9B:
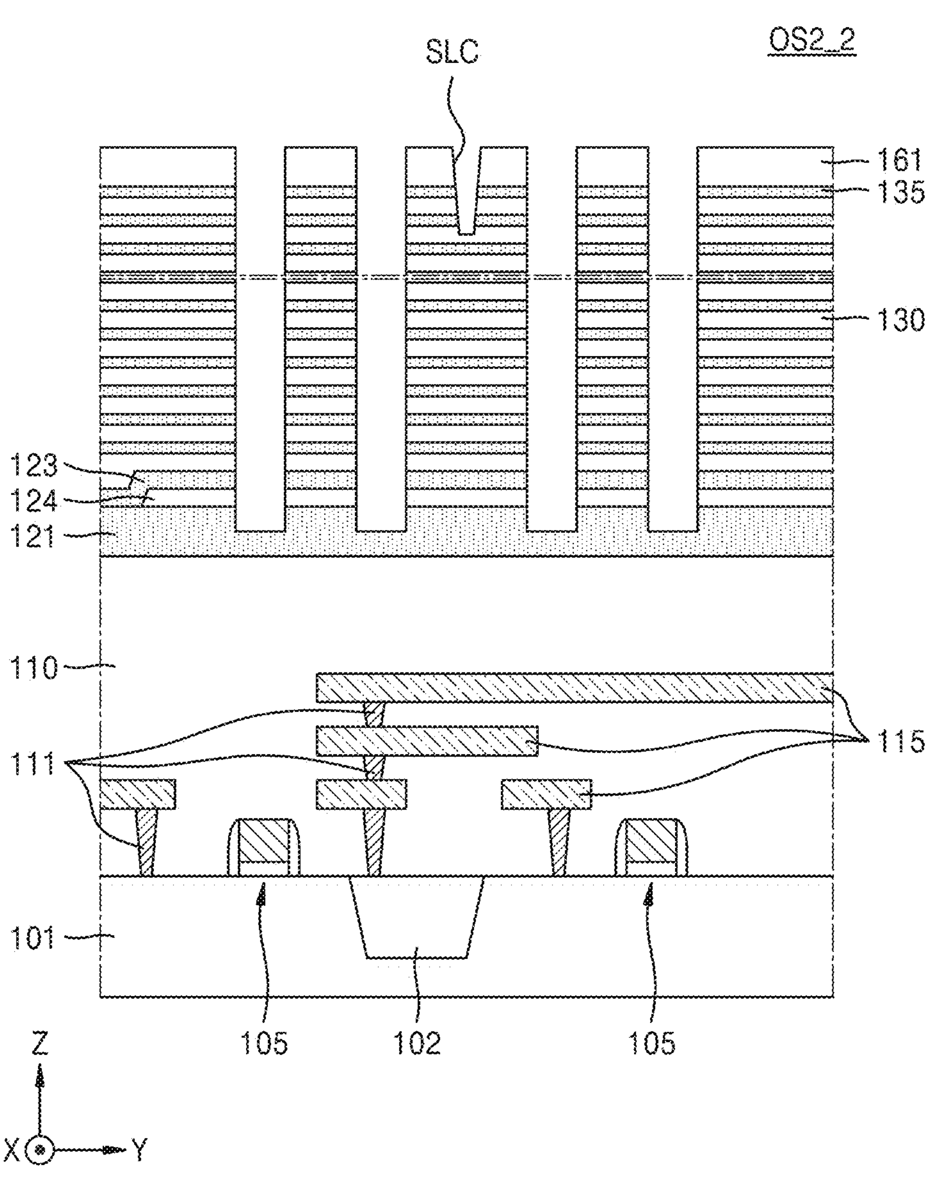
Figure 9C:
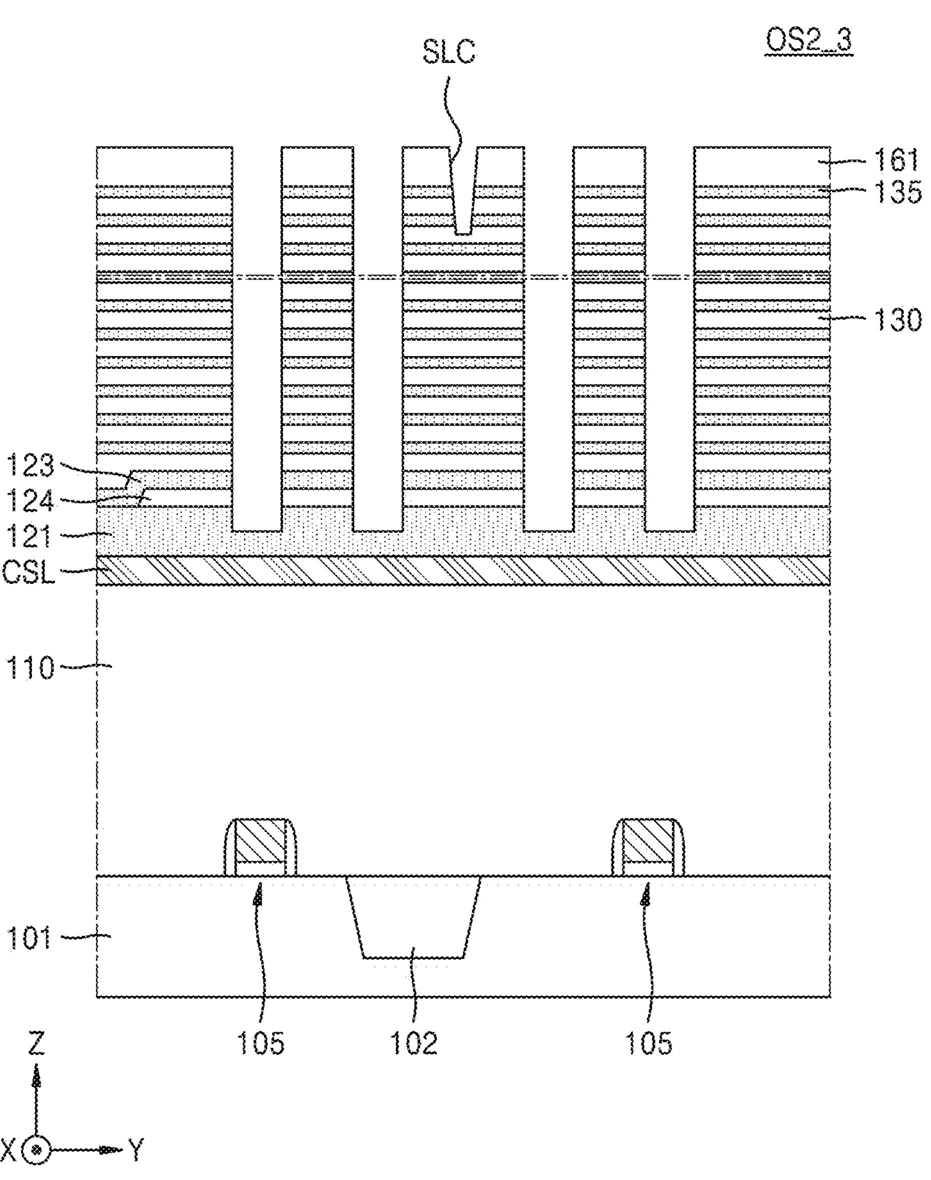
Figure 9D:
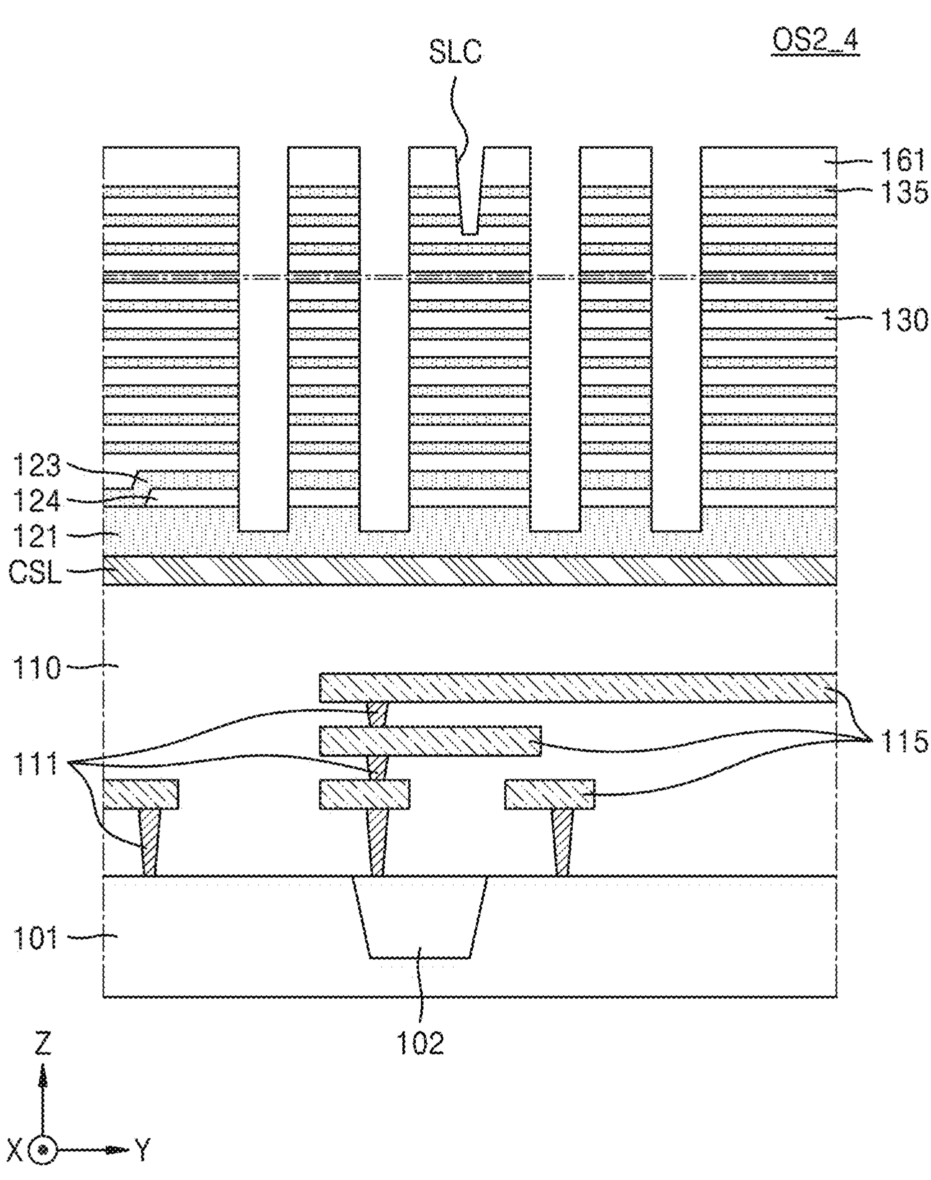
Figure 9E:
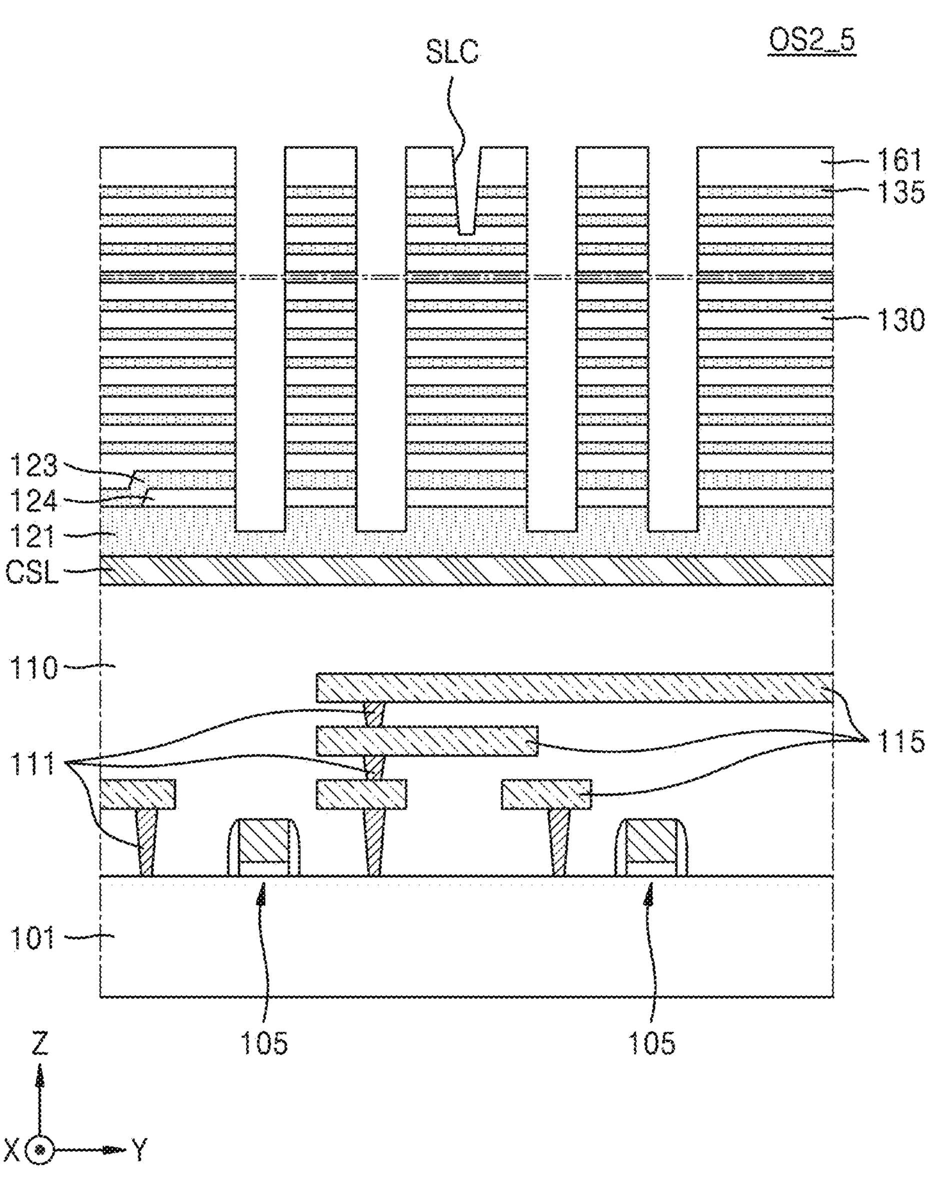
Figure 9F:
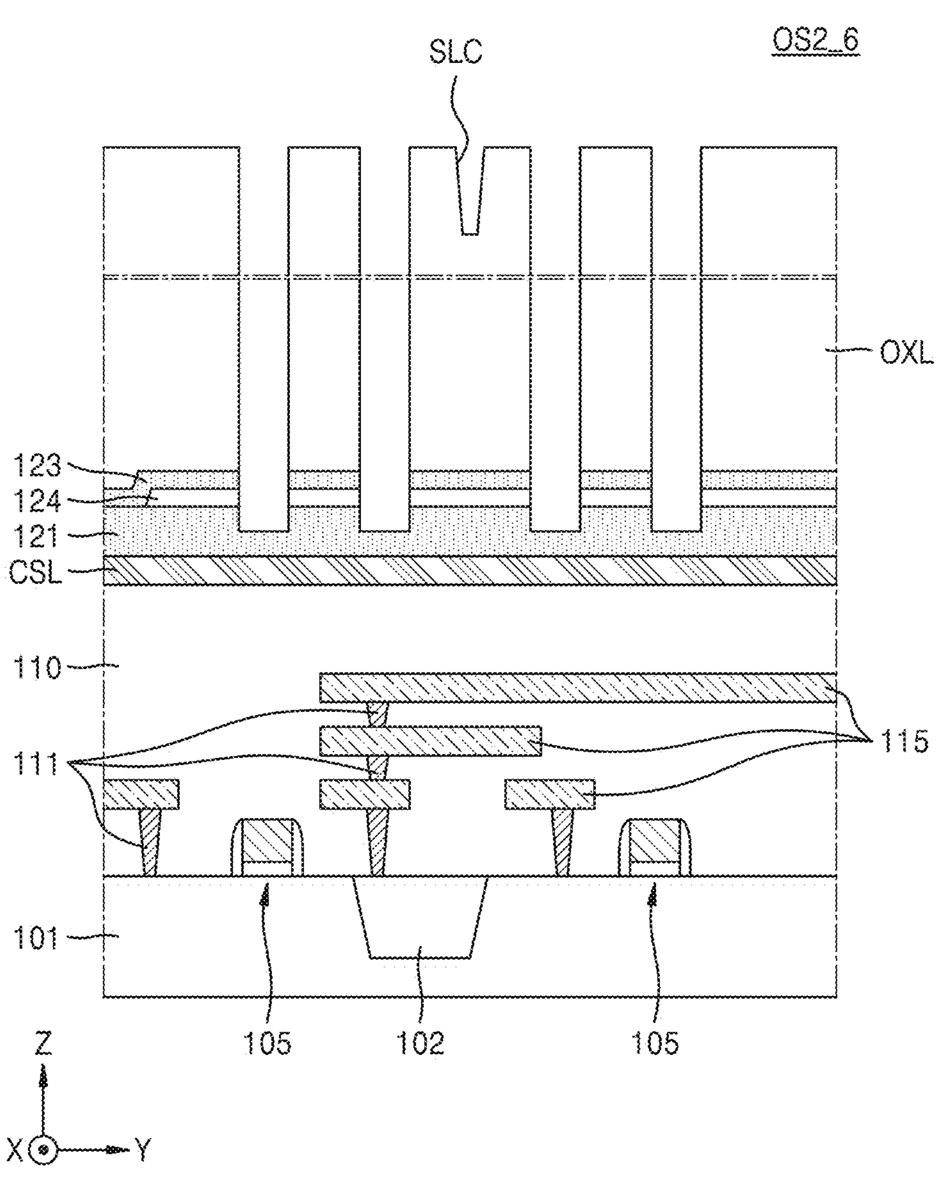
Figure 9G:
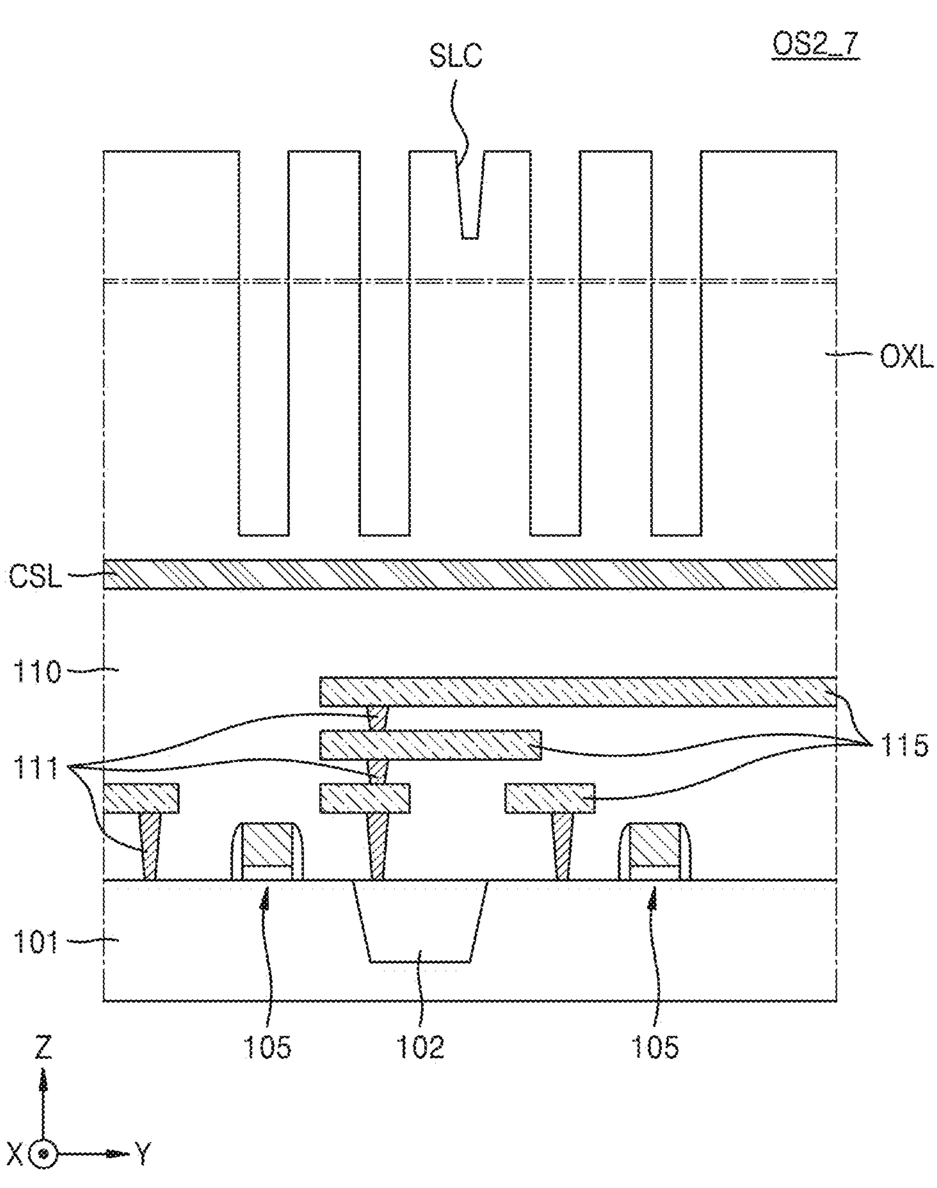
Figure 9H:
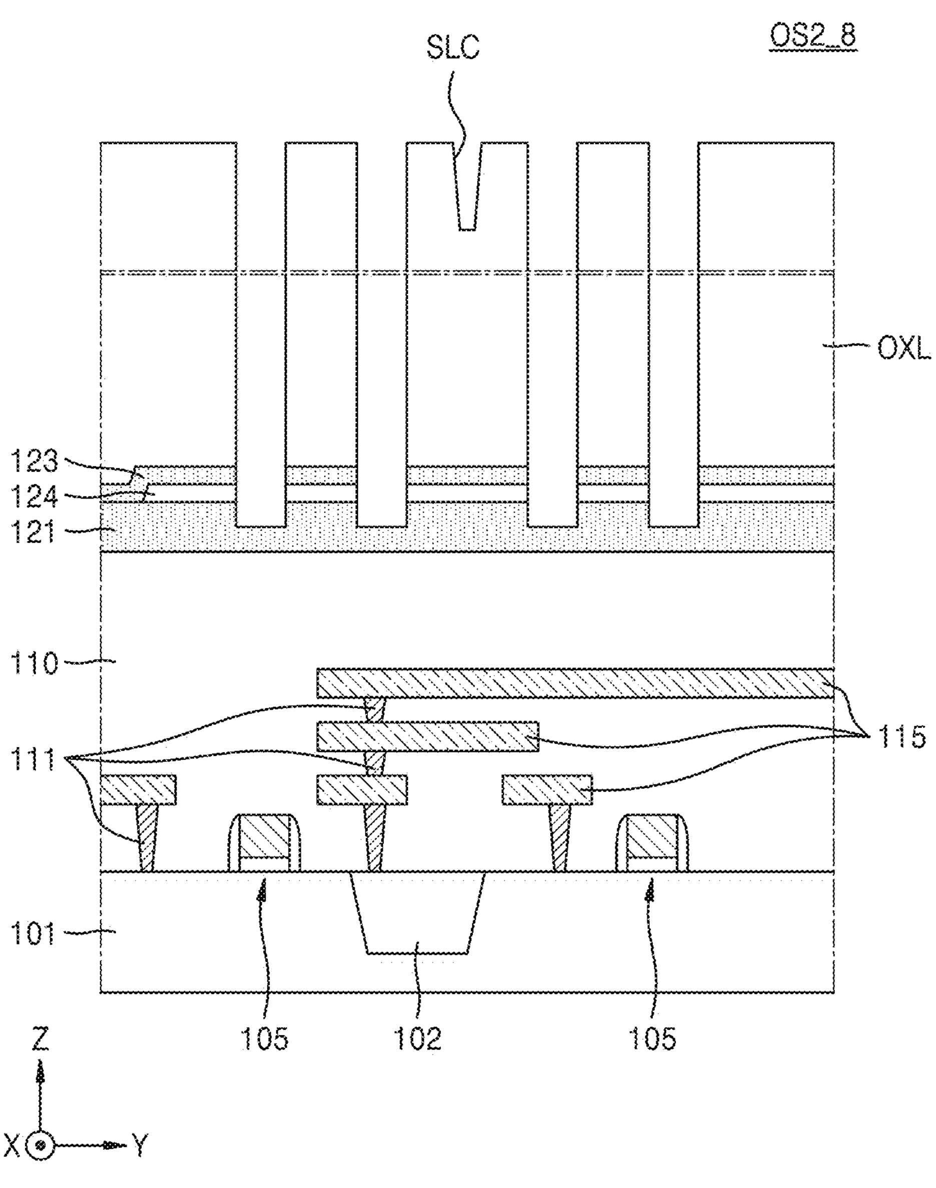
Figure 9I:
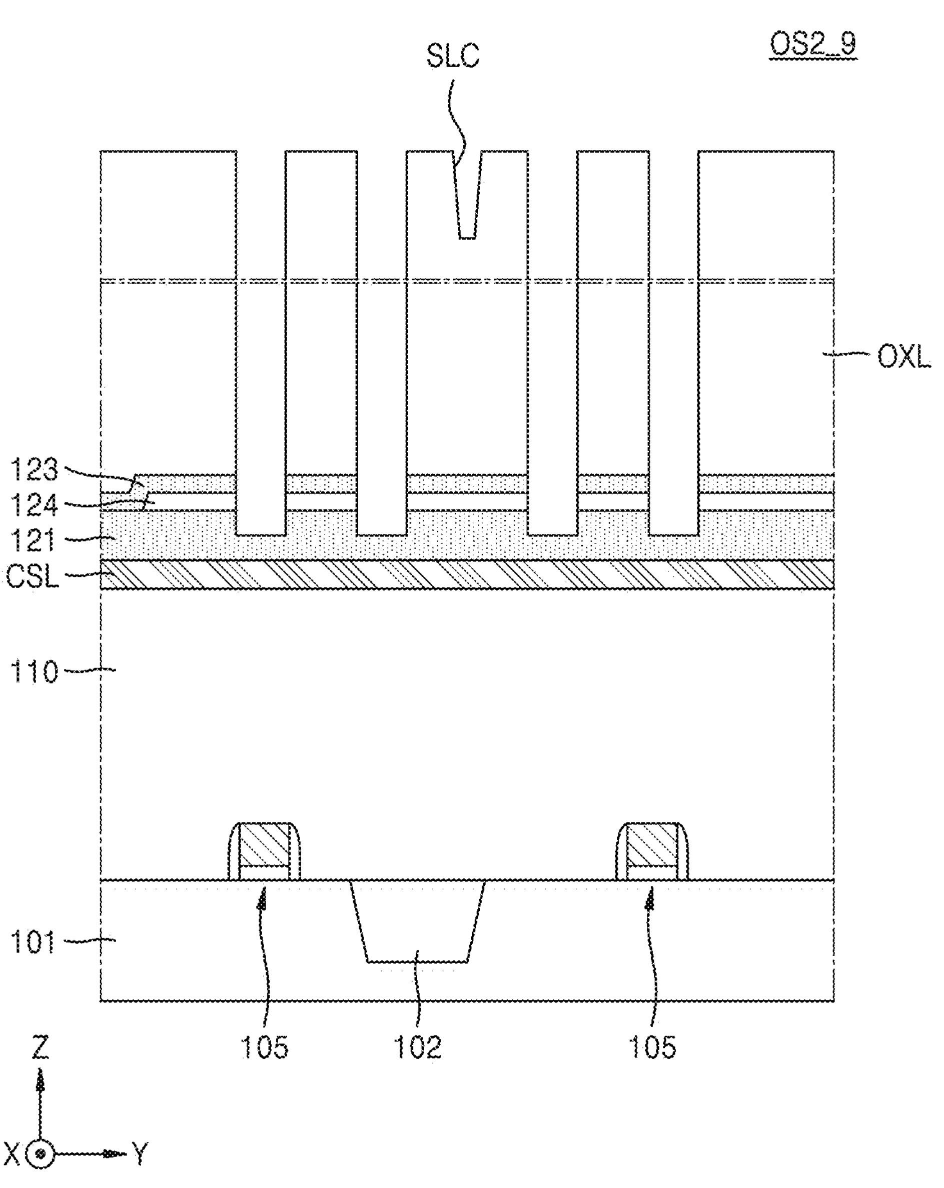
Figure 9J:
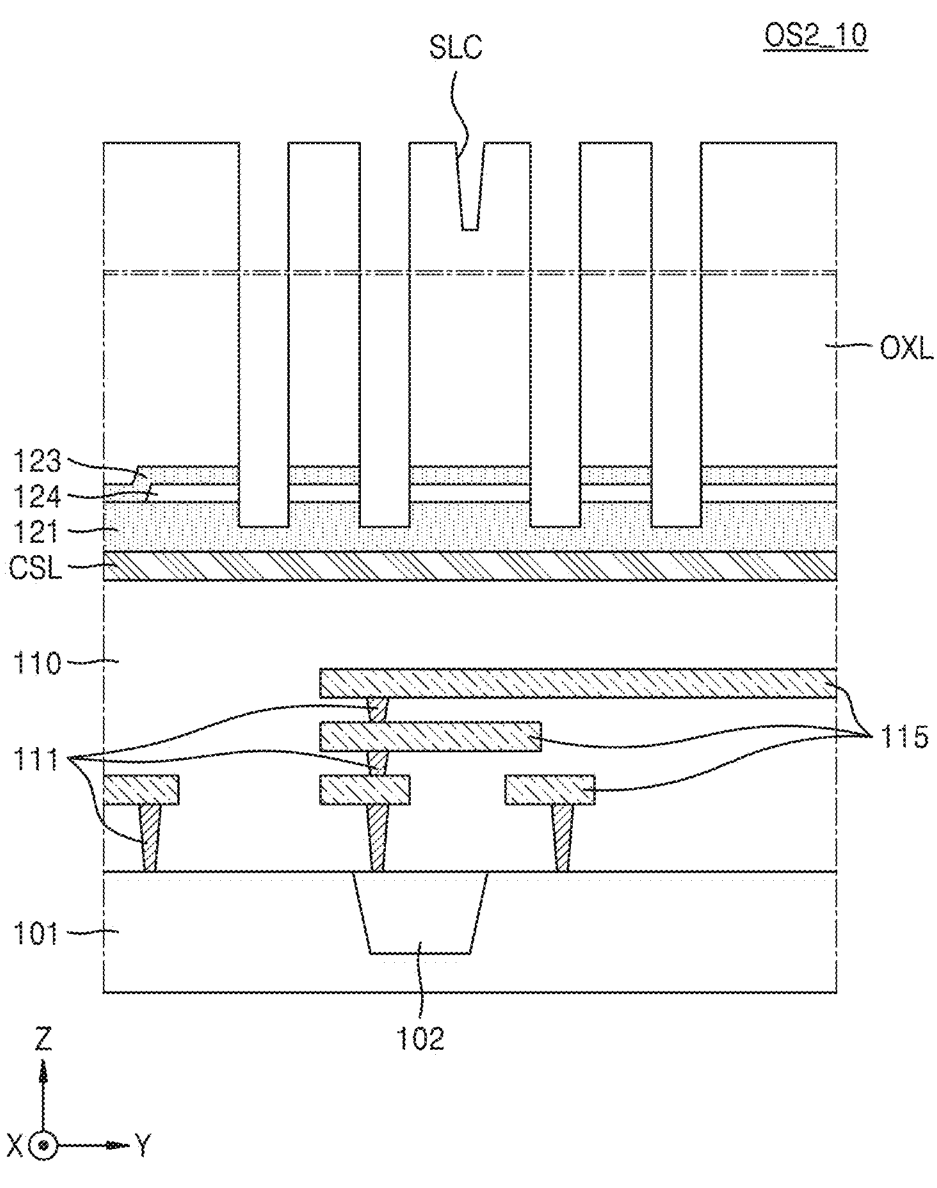
Figure 9K:
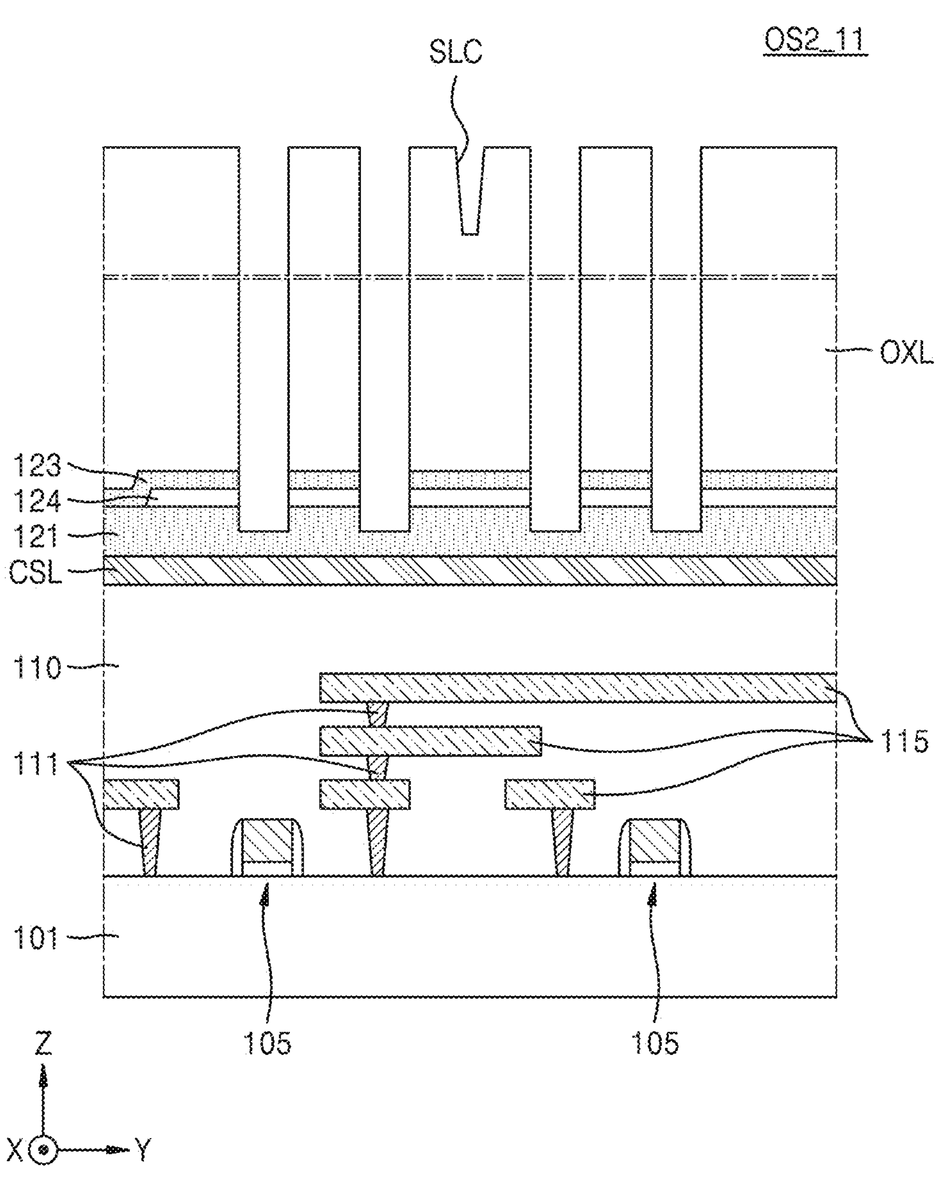

The second observation sites include a second observation site OS2_1 of FIG. 9A, a second observation site OS2_2 of FIG. 9B, a second observation site OS2_3 of FIG. 9C, a second observation site OS2_4 of FIG. 9D, a second observation site OS2_5 of FIG. 9E, a second observation site OS2_6 of FIG. 9F, a second observation site OS2_7 of FIG. 9G, a second observation site OS2_8 of FIG. 9H, a second observation site OS2_9 of FIG. 9I, a second observation site OS2_10 of FIG. 9J, and a second observation site OS2_11 of FIG. 9K.

Second observation sites OS2_1, OS2_2, OS2_3, OS2_4, OS2_5, OS2_6, OS2_7, OS2_8, OS2_9, OS2_10, and OS2_11 may be sequentially referred to as first to eleventh modification observation sites, respectively.

Referring to FIGS. 8 and 9A, the second observation site OS2_1 is similar to the target structure TS1 of FIG. 8, but the first semiconductor layer 121, the third semiconductor layer 123, and the lower sacrificial layer 124 may be omitted.

The spaces occupied by the first semiconductor layer 121, the third semiconductor layer 123, and the lower sacrificial layer 124 in the target structure TS1 may be filled by the lowermost one of the insulation layers 130 at the second observation site OS2_1.

Referring to FIGS. 8 and 9B, the second observation site OS2_2 is similar to the target structure TS1 of FIG. 8, but the conductive plate CSL may be omitted.

The space occupied by the conductive plate CSL in the target structure TS1 may be filled by the lower insulation layer 110 at the second observation site OS2_2.

Referring to FIGS. 8 and 9C, the second observation site OS2_3 is similar to the target structure TS1 of FIG. 8, but the peripheral circuit wires including the conductive vias 111 and the conductive patterns 115 may be omitted.

The spaces occupied by the peripheral circuit wires including the conductive vias 111 and the conductive patterns 115 in the target structure TS1 may be filled by the lower insulation layer 110 at the second observation site OS2_3.

Referring to FIGS. 8 and 9D, the second observation site OS2_4 is similar to the target structure TS1 of FIG. 8, but the peripheral transistors 105 may be omitted.

The spaces occupied by the peripheral transistors 105 in the target structure TS1 may be filled by the lower insulation layer 110 at the second observation site OS2_4.

Referring to FIGS. 8 and 9E, the second observation site OS2_5 is similar to the target structure TS1 of FIG. 8, but the device isolation layer 102 may be omitted.

The space occupied by the device isolation layer 102 in the target structure TS1 may be filled by the substrate 101 at the second observation site OS2_5.

Referring to FIGS. 8 and 9F, the second observation site OS2_6 is similar to the target structure TS1 of FIG. 8, but the plurality of insulation layers 130 and the plurality of sacrificial layers 135 may be replaced by an oxide film OXL.

Referring to FIGS. 8 and 9G, the second observation site OS2_7 is similar to the target structure TS1 of FIG. 8, but the plurality of insulation layers 130 and the plurality of sacrificial layers 135 may be replaced by the oxide film OXL, and the first semiconductor layer 121, the third semiconductor layer 123, and the lower sacrificial layer 124 may be omitted.

The spaces occupied by the first semiconductor layer 121, the third semiconductor layer 123, and the lower sacrificial layer 124 in the target structure TS1 may be filled by the lowermost one of the insulation layers 130 at the second observation site OS2_7.

Referring to FIGS. 8 and 9H, the second observation site OS2_8 is similar to the target structure TS1 of FIG. 8, but the plurality of insulation layers 130 and the plurality of sacrificial layers 135 may be replaced by an oxide film OXL, and the conductive plate CSL may be omitted.

The space occupied by the conductive plate CSL in the target structure TS1 may be filled by the lower insulation layer 110 at the second observation site OS2_8.

Referring to FIGS. 8 and 9I, the second observation site OS2_9 is similar to the target structure TS1 of FIG. 8, but the plurality of insulation layers 130 and the plurality of sacrificial layers 135 may be replaced by the oxide film OXL, and the peripheral circuit wires including the conductive vias 111 and the conductive patterns 115 may be omitted.

The spaces occupied by the peripheral circuit wires including the conductive vias 111 and the conductive patterns 115 in the target structure TS1 may be filled by the lower insulation layer 110 at the second observation site OS2_9.

Referring to FIGS. 8 and 9J, the second observation site OS2_10 is similar to the target structure TS1 of FIG. 8, but the plurality of insulation layers 130 and the plurality of sacrificial layers 135 may be replaced by the oxide film OXL, and the peripheral transistors 105 may be omitted.

The spaces occupied by the peripheral transistors 105 in the target structure TS1 may be filled by the lower insulation layer 110 at the second observation site OS2_10.

Referring to FIGS. 8 and 9K, the second observation site OS2_11 is similar to the target structure TS1 of FIG. 8, but the plurality of insulation layers 130 and the plurality of sacrificial layers 135 may be replaced by the oxide film OXL, and the device isolation layer 102 may be omitted.

The space occupied by the device isolation layer 102 in the target structure TS1 may be filled by the substrate 101 at the second observation site OS2_11.

Although an embodiment in which the second observation sites OS2_1, OS2_2, OS2_3, OS2_4, OS2_5, OS2_6, OS2_7, OS2_8, OS2_9, OS2_10, and OS2_11 of FIGS. 9A to 9K are each inspected by either an optoacoustic inspection or an ultrasonic inspection has been described, it is merely an example and does not limit embodiments of the present disclosure in any sense. For example, each of additional observation sites may be inspected through either an optoacoustic inspection or an ultrasonic inspection or only some of the second observation sites OS2_1, OS2_2, OS2_3, OS2_4, OS2_5, OS2_6, OS2_7, OS2_8, OS2_9, OS2_10, and OS2_11 may be inspected.

Next, referring to FIGS. 2A and 8, in operation P30, the target structure TS1 may be inspected. The inspection of the target structure TS1 may be either an optoacoustic inspection or an ultrasonic inspection.

Data obtained in operations P10 to P30 is referred to as measurement data regarding first observation sites, second observation sites, and a target structure.

Subsequently, in operation P40, the measurement data regarding the first observation sites, the second observation sites, and the target structures may be pre-processed. The pre-processing may include removing noise (e.g., DC noise and low-frequency noise) of the measurement data regarding the first observation sites, the second observation sites, and the target structures. For example, the measurement data may correspond to a time-intensity graph, and the pre-processing may correspond to time domain curve fitting. According to example embodiments, low-frequency components included in the measurement data regarding the first observation sites, the second observation sites, and the target structures may be removed through curve fitting.

Subsequently, in operation P50, the measurement data regarding the first observation sites, the second observation sites, and the target structures may be transformed. The measurement data regarding the first observation sites, the second observation sites, and the target structures may be transformed through Short-Time Fourier Transform (STFT), and thus, transformed data may be generated. The transformed data may correspond to a spectrogram similar to that shown in FIG. 10.

Subsequently, in operation P60, a medium constructive interference period may be calculated. The medium constructive interference period may be determined based on elements included in the target structures. Since the target structure TS1 of FIG. 8 includes the plurality of channel holes CHH formed in the plurality of insulation layers 130 and the plurality of sacrificial layers 135, the medium constructive interference period of the target structure TS1 may be calculated from a physical model based on known factors of the plurality of insulation layers 130 and the plurality of sacrificial layers 135, i.e., thicknesses, refractive indices, and attenuation coefficients.

Subsequently, in operation P70, frequency filtering may be performed on the transformed data based on the medium constructive interference period.

According to example embodiments, the frequency filtering may include applying a bandpass filter to the transformed data. According to example embodiments, the frequency filtering may preserve signals within a passband of the transformed data and remove signals outside the passband of the transformed data.

According to example embodiments, the passband may be determined to contain a constructive interference frequency determined according to a medium constructive interference period. For example, when the constructive interference frequency determined according to the medium constructive interference period is about 20 MHz, the passband may be in a range from about 10 MHz to about 40 MHz. In this example, the lower end of each of the spectrograms of FIG. 10 may be 10 MHZ, and the upper end may be 40 MHZ.

Data obtained in operation P70 is referred to as filtered data regarding first observation sites, second observation sites, and a target structure.

Figure 10:
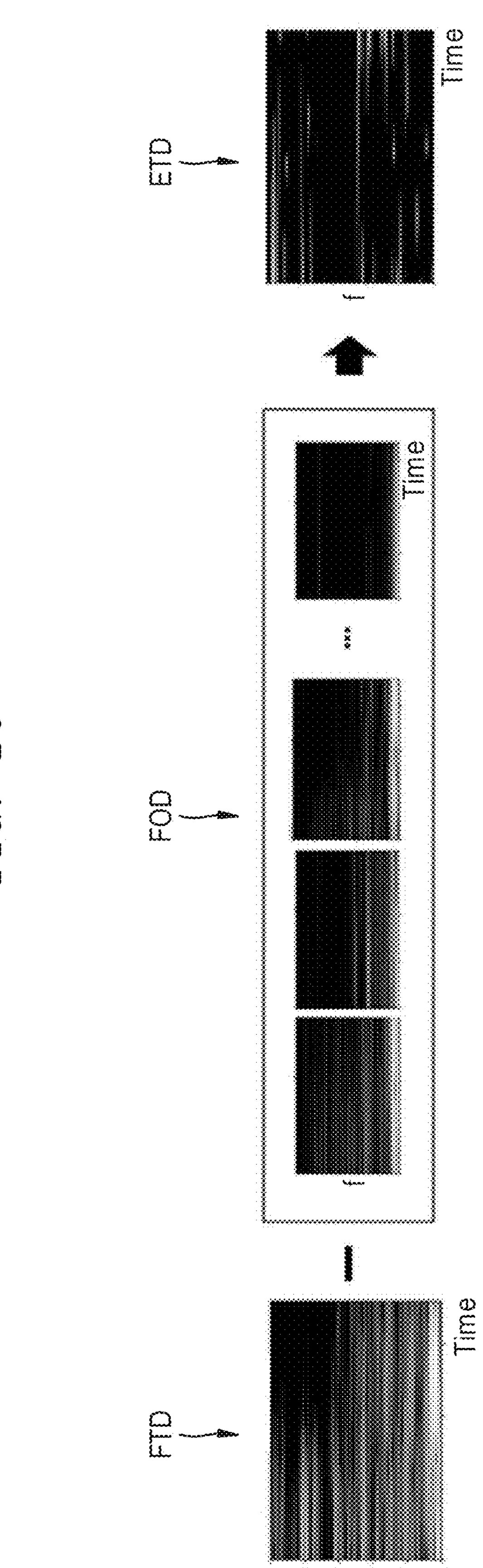
FIG. 10 is a diagram for describing a method of manufacturing a semiconductor device, according to example embodiments.

FIG. 10 is a diagram for describing a method of manufacturing a semiconductor device, according to example embodiments.

Referring to FIGS. 2A and 10, in operation P80, by performing calculations between filtered data FTD regarding a target structure and filtered data FOD regarding first observation sites and second observation sites, extracted data ETF from an element of interest of the target structure may be generated.

Since filtered data FTD, FOD, and ETF of FIG. 10 is data transformed by STFT, the filtered data FTD, FOD, and ETF is three-dimensional data determined by the time axis, the frequency (Q) axis, and the brightness (i.e., pixel values). Spectrograms of the filtered data FTD, FOD, and ETF may be displayed as images as shown in FIG. 10, and, in some cases, unlike in FIG. 10, the spectrograms may be displayed as vectors or tensors. The vertical axis size of each of the filtered data FTD, FOD, and ETF is determined by the filtering in operation P60.

The calculations in operation P80 may remove signals related to the characteristic frequency of first observation sites and second observation sites from the filtered data FOD regarding the target structure. Here, the characteristic frequency may be arbitrary sites on images of the filtered data FOD regarding the first observation sites and the second observation sites.

In other words, generating the extracted data ETD may include removing values of pixels (that is, making values of pixels to 0) from the filtered data FTD that overlap non-zero pixels on the filtered data FOD. Therefore, non-zero pixels of the extracted data ETD may be pixels that do not overlap the non-zero pixels of the filtered data FOD.

According to example embodiments, the first observation sites may be intermediate results for forming the target structure TS1, and, by comparing transformed data regarding the first observation sites with one another or comparing transformed data regarding the first observation sites with transformed data regarding the target structure TS1, influences of adjacent elements below the plurality of sacrificial layers 135 and the plurality of channel holes CHH to the transformed data regarding the first observation sites and the transformed data regarding the target structure TS1 may be determined.

The adjacent elements refer to, as described above, the first semiconductor layer 121, the third semiconductor layer 123, the lower sacrificial layer 124, the conductive plate CSL, the peripheral circuit wires including the conductive vias 111 and the conductive patterns 115, the peripheral transistors 105, and the device isolation layer 102.

In detail, the element of interest of the target structure TS1 may be the plurality of channel holes CHH, and induced signals may be extracted, based on calculations between the filtered data FTD regarding the first observation sites and the filtered data FOD regarding the target structure TS1.

The second observation sites may be modified structures obtained by omitting some elements from the target structure TS1, and, by comparing transformed data regarding the second observation sites with one another or comparing the transformed data regarding the second observation sites with the transformed data regarding the target structure TS1, influences of elements formed on the substrate 101 to the transformed data regarding the second observation sites and the transformed data regarding the target structure TS1 may be determined.

In detail, the element of interest of the target structure TS1 may be the plurality of channel holes CHH, and signals induced by adjacent elements of the plurality of channel holes CHH may be removed based on calculations (e.g., difference calculations) between the transformed data regarding the second observation sites and the transformed data regarding the target structure TS1.

In particular, when there is no alternate stacking structure of the plurality of insulation layers 130 and the plurality of sacrificial layers 135, by performing the calculations between the second observation site of FIG. 9F and the second observation sites of FIGS. 9G to 9K, the influence of the adjacent elements to the transformed data regarding the target structure TS1 may be determined.

Recently, as the number of stacked stages of a vertical memory device increases, the aspect ratio of channel holes has rapidly been increasing. An optoacoustic inspection and an ultrasonic inspection exhibit insufficient sensitivity and resolution for such a structure having a high aspect ratio. Therefore, results of an optoacoustic inspection and an ultrasonic inspection of a structure having a high aspect ratio do not show a significant difference between a normal case and a defective case (e.g., defective in depth and etch profile). The problem occurs not only in a cell gate metal contact and a peripheral circuit contact of a NAND flash memory, but also in the formation of an opening for forming a storage node electrode (i.e., a lower electrode) of dynamic random-access memory (DRAM).

According to example embodiments, in a complex structure having a high aspect ratio, the resolution and sensitivity for elements of interest and adjacent elements may be improved by identifying signals corresponding to elements other than the element of interest.

Figure 11A:
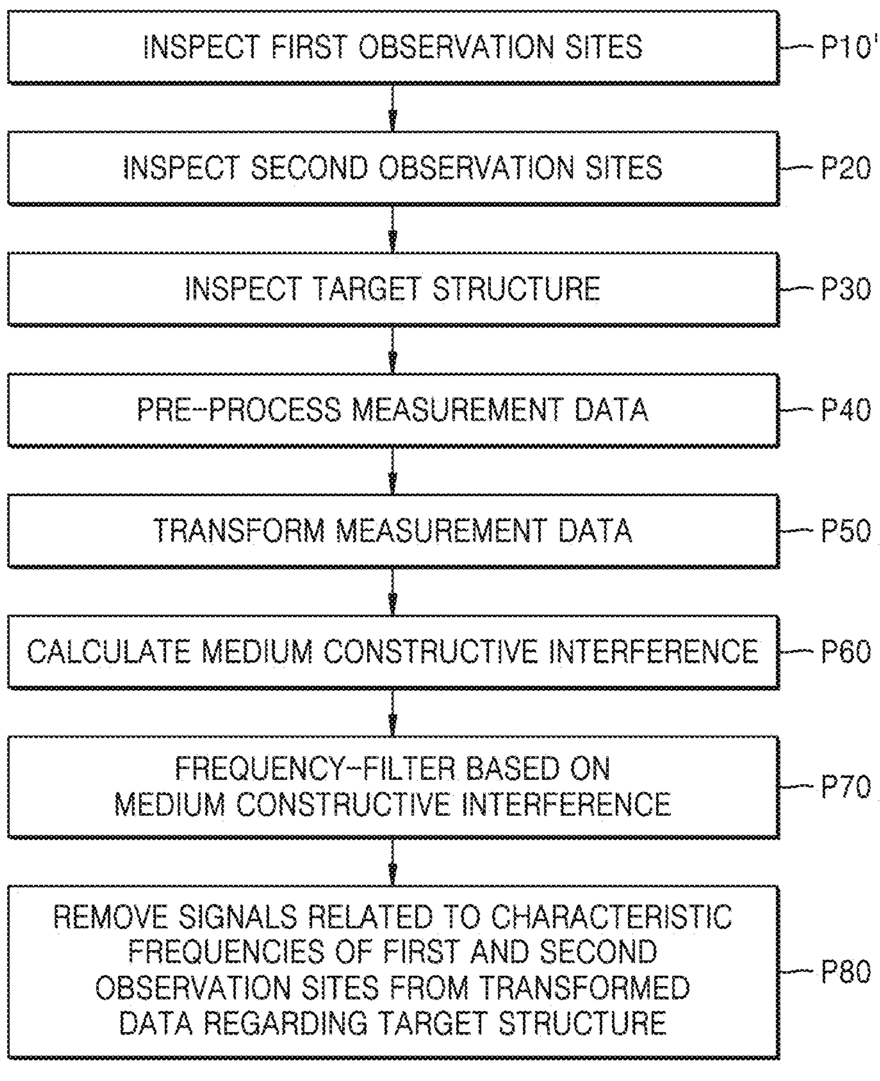
FIG. 11A is a flowchart of a method of manufacturing a semiconductor device, according to example embodiments.

FIG. 11A is a flowchart of a method of manufacturing a semiconductor device, according to example embodiments.

Figure 11B:
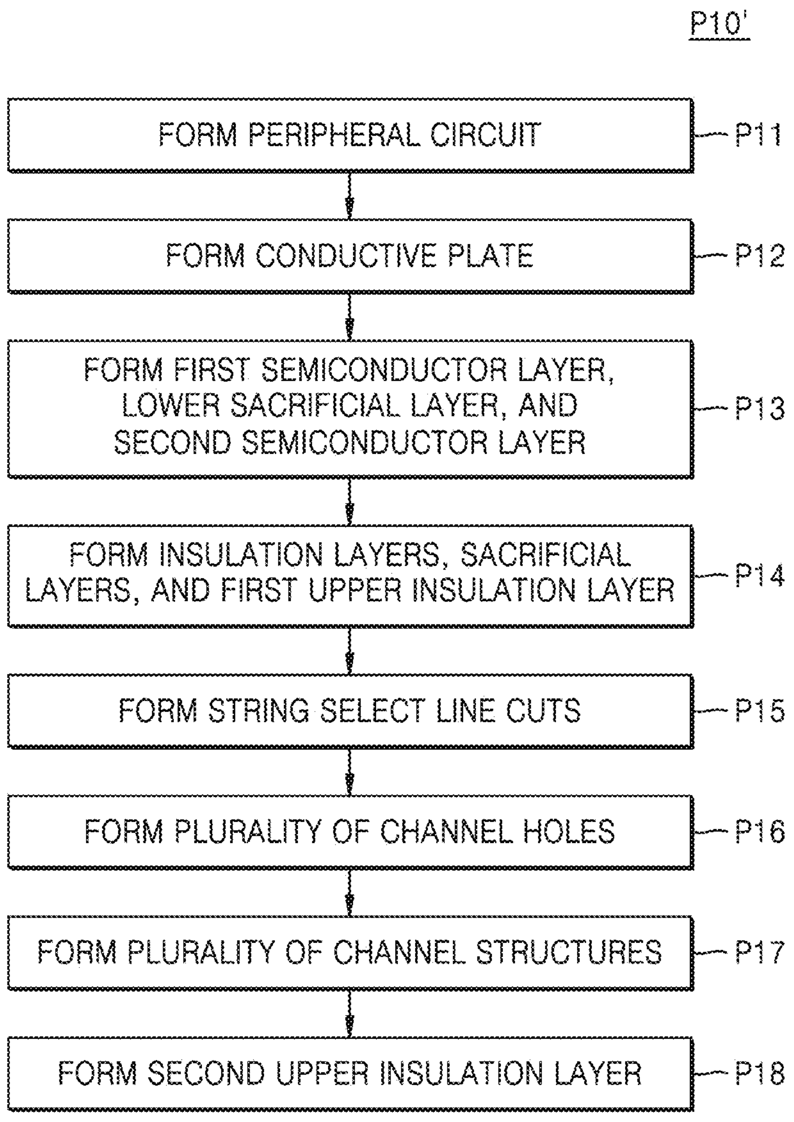
FIG. 11B is a flowchart for describing an operation of FIG. 11A.

FIG. 11B is a flowchart for describing operation P10' of FIG. 11A. Operation P10' may include operations P11 to P18, as described below.

The method of manufacturing a semiconductor device of FIG. 11A is substantially the same as that described with reference to FIG. 1A except for operation P10', and thus, descriptions identical to those already given above are omitted.

Operation P10' may further include operations P17 and P18 in addition to those of operation P10 of FIG. 2B. Operations P11 to P15 are substantially the same as those described with reference to FIG. 2B, and operation P16 is substantially the same as the formation of the target structure TS1 described with reference to FIG. 8. Therefore, descriptions identical to those already given above are omitted. Here, the target structure TS1 of FIG. 8, which is the target structure in the previous embodiment, may correspond to a first observation site OS1_6 in the present embodiment.

FIGS. 12 to 19 are cross-sectional views for describing a method of manufacturing a semiconductor device, according to example embodiments.

Referring to FIGS. 11B and 12, a plurality of channel structures 150 may be formed in operation P17. Therefore, a first observation site OS17 may be formed.

A gate insulating material, a channel material, and a buried insulating material that fill at least a portion of each of the plurality of channel holes CHH (refer to FIG. 8) may be sequentially provided. According to some embodiments, the gate insulating material may include a charge blocking material, a charge storage material, and a tunnel insulating material. Subsequently, an etch-back process may be performed to expose the top surface of the first upper insulation layer 161. Subsequently, after upper portions of the buried insulating material in the plurality of channel holes CHH are further removed, a channel material may be deposited to cover the upper portions of a buried insulation layer 151. Therefore, upper portions of channel layers 153 may provide pads for contacting bit line contacts 171 (refer to FIG. 19), respectively.

After the first observation site OS1_7 is formed, an inspection on the first observation site OS1_7 may be performed. The inspection on the first observation site OS1_7 may be either the optoacoustic inspection or the ultrasonic inspection described with reference to FIG. 1.

Referring to FIGS. 11B and 13, a second upper insulation layer 163 may be formed in operation P18. Therefore, a first observation site OS18 may be formed.

According to some embodiments, the second upper insulation layer 163 may include an insulating material. The second upper insulation layer 163 may cover the top surfaces of the channel structures 150 and the top surface of the first upper insulation layer 161. The second upper insulation layer 163 may fill the inner space of the string select line cut SLC.

After the first observation site OS1_8 is formed, an inspection on the first observation site OS1_8 may be performed. The inspection on the first observation site OS1_8 may be either the optoacoustic inspection or the ultrasonic inspection described with reference to FIG. 1.

Referring to FIGS. 11B and 14, the word line cuts WLC may be formed. Therefore, the target structure TS2 may be formed.

The formation of the word line cuts WLC may include providing a hard mask pattern on the first upper insulation layer 161 and etching the first upper insulation layer 161, the second upper insulation layer 163, the plurality of sacrificial layers 135, and the plurality of insulation layers 130 by using the hard mask pattern as an etching mask.

After the word line cuts WLC are formed, the hard mask pattern may be removed. According to some embodiments, the word line cuts WLC may have a tapered shape in a Z direction. According to some embodiments, the X-direction length of the word line cuts WLC may be greater than the X-direction length of each of the plurality of sacrificial layers 135. Therefore, the word line cuts WLC may horizontally separate the plurality of sacrificial layers 135 from one another.

The target structure TS2 may be inspected in operation P30 of FIG. 11A. The inspection on the target structure TS2 may be either the optoacoustic inspection or the ultrasonic inspection described with reference to FIG. 1.

Figure 15:
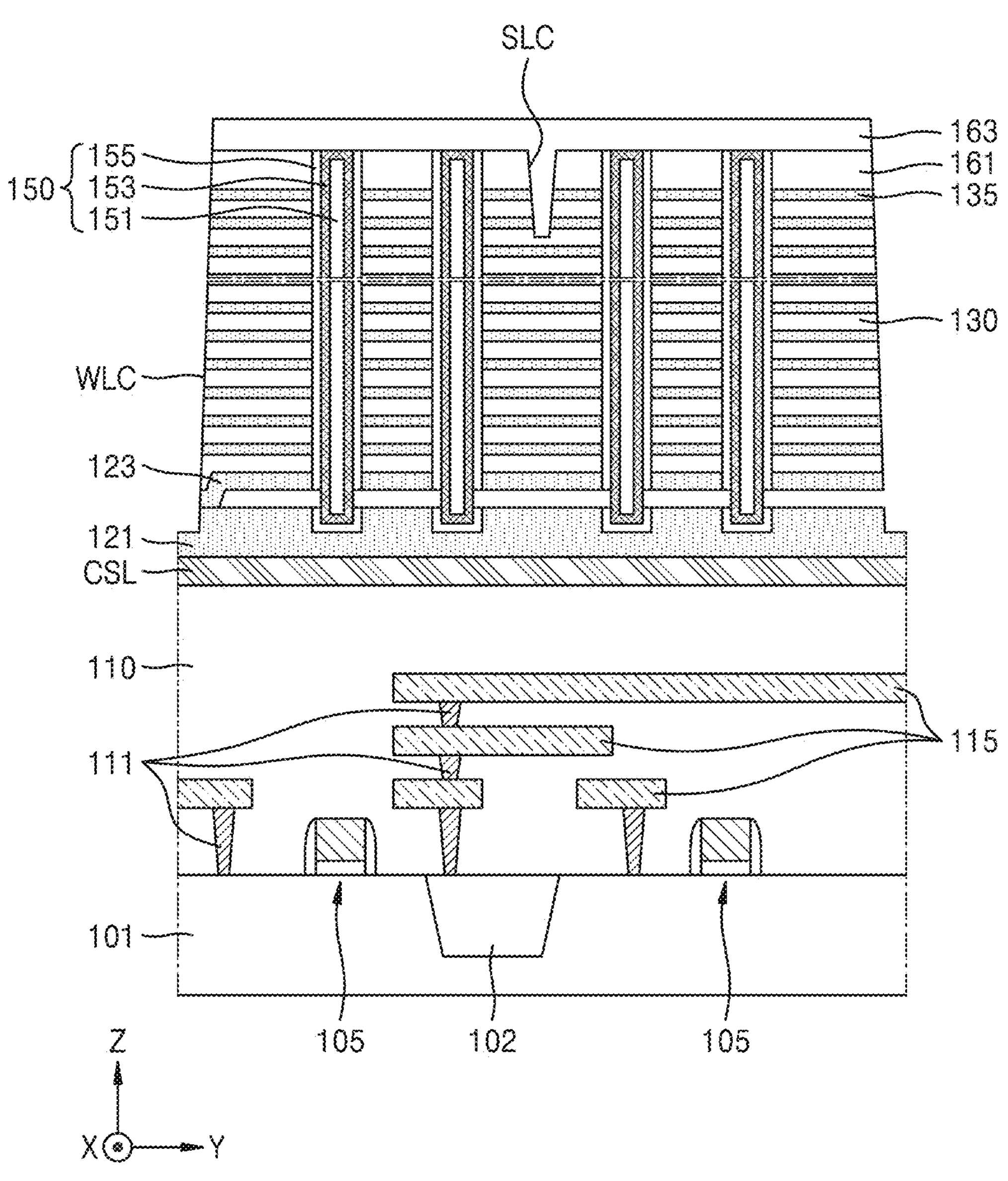

Next, referring to FIG. 15, the lower sacrificial layer 124 may be removed.

According to some embodiments, a word line cut liner may be formed by providing a word line cut liner material layer on the word line cuts WLC and removing the lower portion of the word line cut liner material layer. The word line cut liner may include a material having a high etch selectivity with respect to the lower sacrificial layer 124. The plurality of sacrificial layers 135 may be covered by the word line cut liner, but the lower sacrificial layer 124 may be exposed. The word line cut liner may be a layer for protecting the plurality of sacrificial layers 135 during the process of removing the lower sacrificial layer 124.

Even when the lower sacrificial layer 124 is removed, the first semiconductor layer 121 and the third semiconductor layer 123 partially contact each other, and thus, the plurality of insulation layers 130 and the plurality of sacrificial layers 135 may be prevented from collapsing. After removing the lower sacrificial layer 124, the word line cut liner may be removed.

Figure 16:
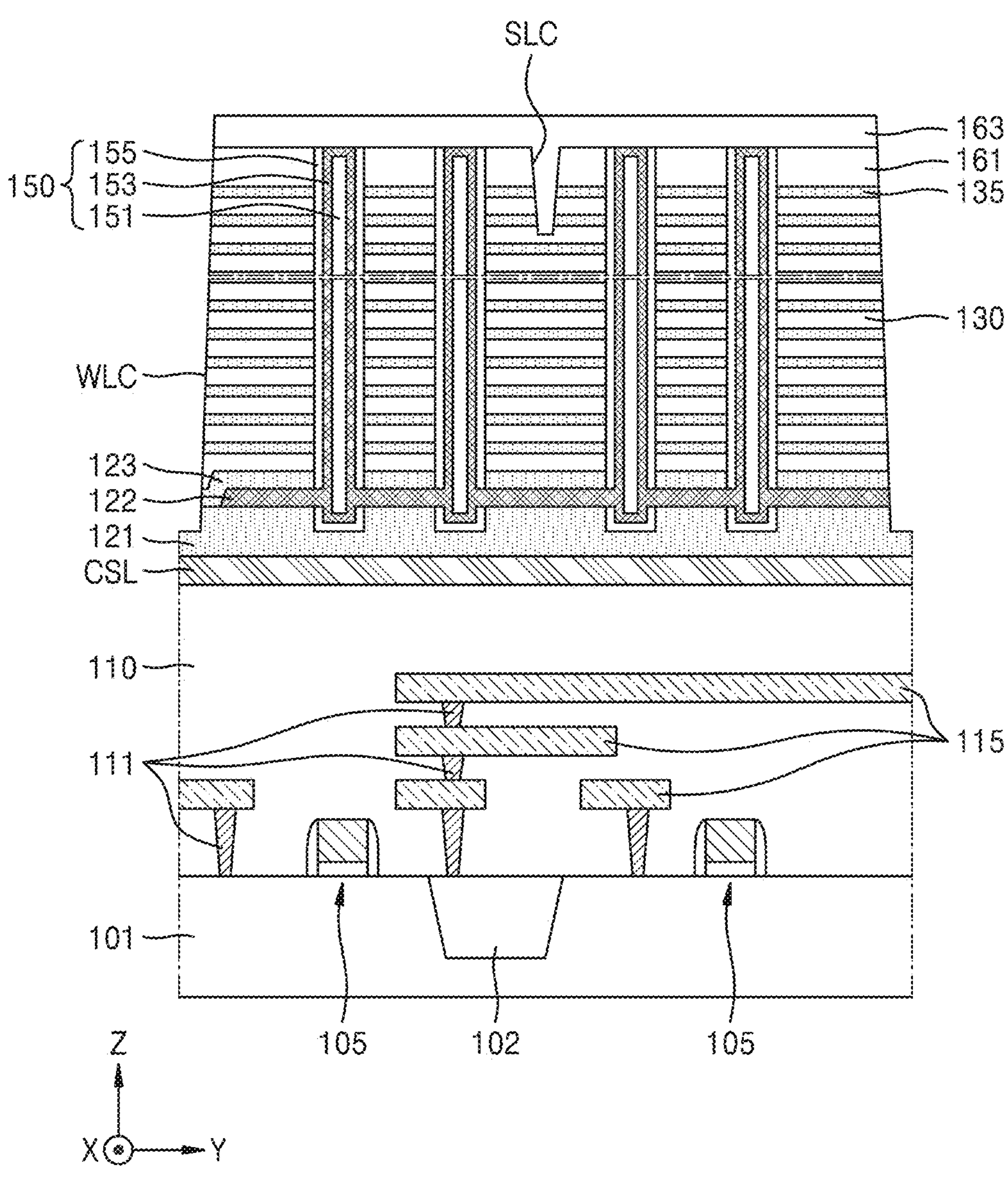

Subsequently, referring to FIG. 16, a second semiconductor layer 122 may be formed.

The formation of the second semiconductor layer 122 may include removing a portion of a gate insulation layer 155 and providing the second semiconductor layer 122. According to example embodiments, the gate insulation layer 155 may be removed through wet etching.

The second semiconductor layer 122 may be provided in a space formed by selectively removing the lower sacrificial layer 124 (refer to FIG. 12). According to some embodiments, the second semiconductor layer 122 may include silicon doped at substantially the same concentration as a doping concentration of the first semiconductor layer 121 and the third semiconductor layer 123. According to some other embodiments, the second semiconductor layer 122 may include silicon doped with a concentration different from a doping concentration of the first semiconductor layer 121 and the third semiconductor layer 123 or may include undoped silicon. According to some embodiments, as dopants of the first semiconductor layer 121 and the third semiconductor layer 123 may be diffused by a subsequent heat treatment process, the second semiconductor layer 122 may be doped at substantially the same concentration as a doping concentration of the first semiconductor layer 121 and the third semiconductor layer 123. The second semiconductor layer 122 may be in contact with the channel layers 153. Therefore, a charge transfer path for each of the plurality of channel structures 150 to operate as a memory cell string may be formed. The second semiconductor layer 122 may be spaced apart from a dummy channel layer and may not contact the dummy channel layer.

Figure 17:
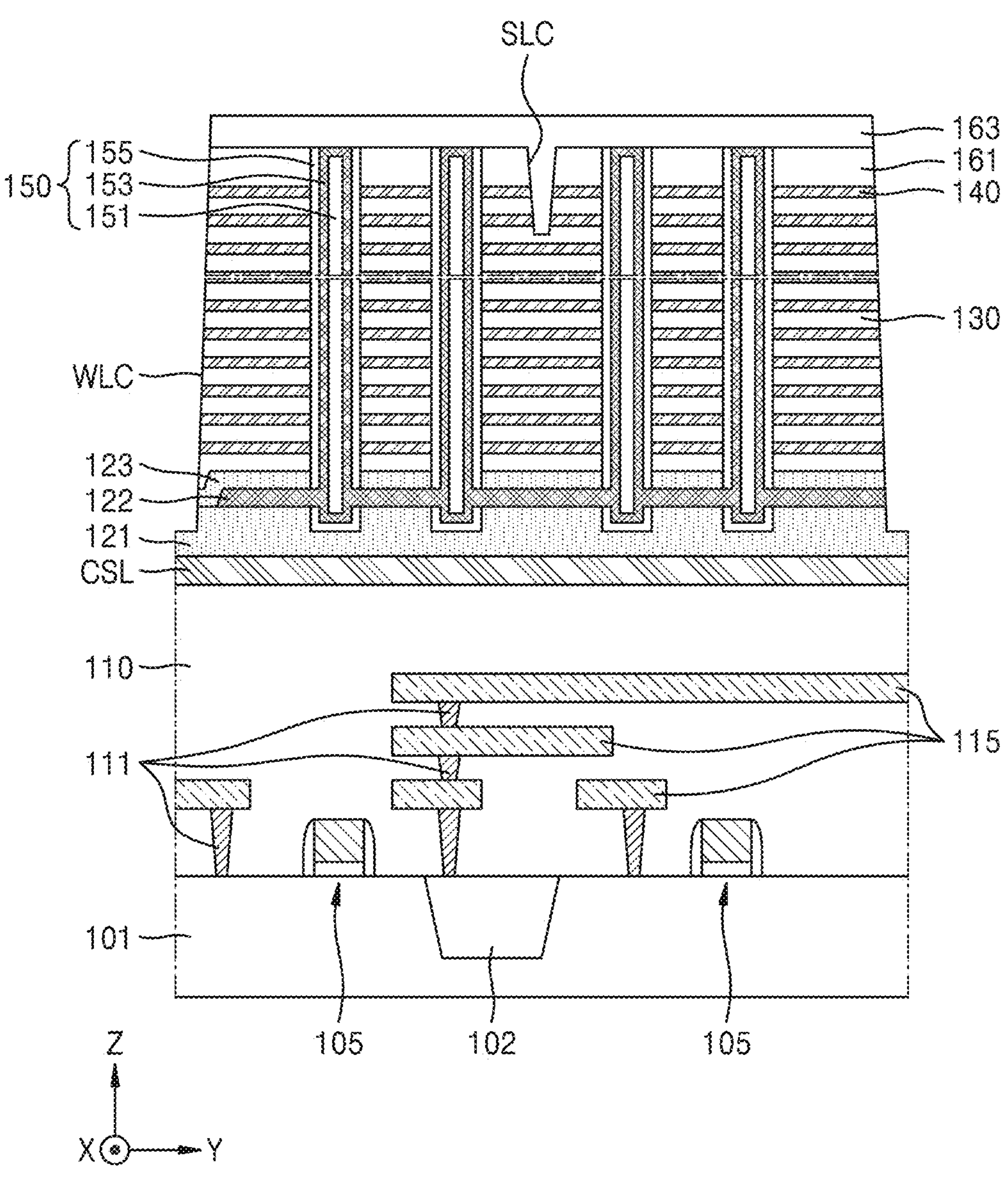

Next, referring to FIG. 17, a plurality of gate electrodes 140 may be formed. The formation of the plurality of gate electrodes 140 may include removing the plurality of sacrificial layers 135 through wet etching, providing a gate electrode material through the word line cuts WLC in a space formed by removing the plurality of sacrificial layers 135, and removing the gate electrode material in the word line cuts WLC for node separation.

Figure 18:
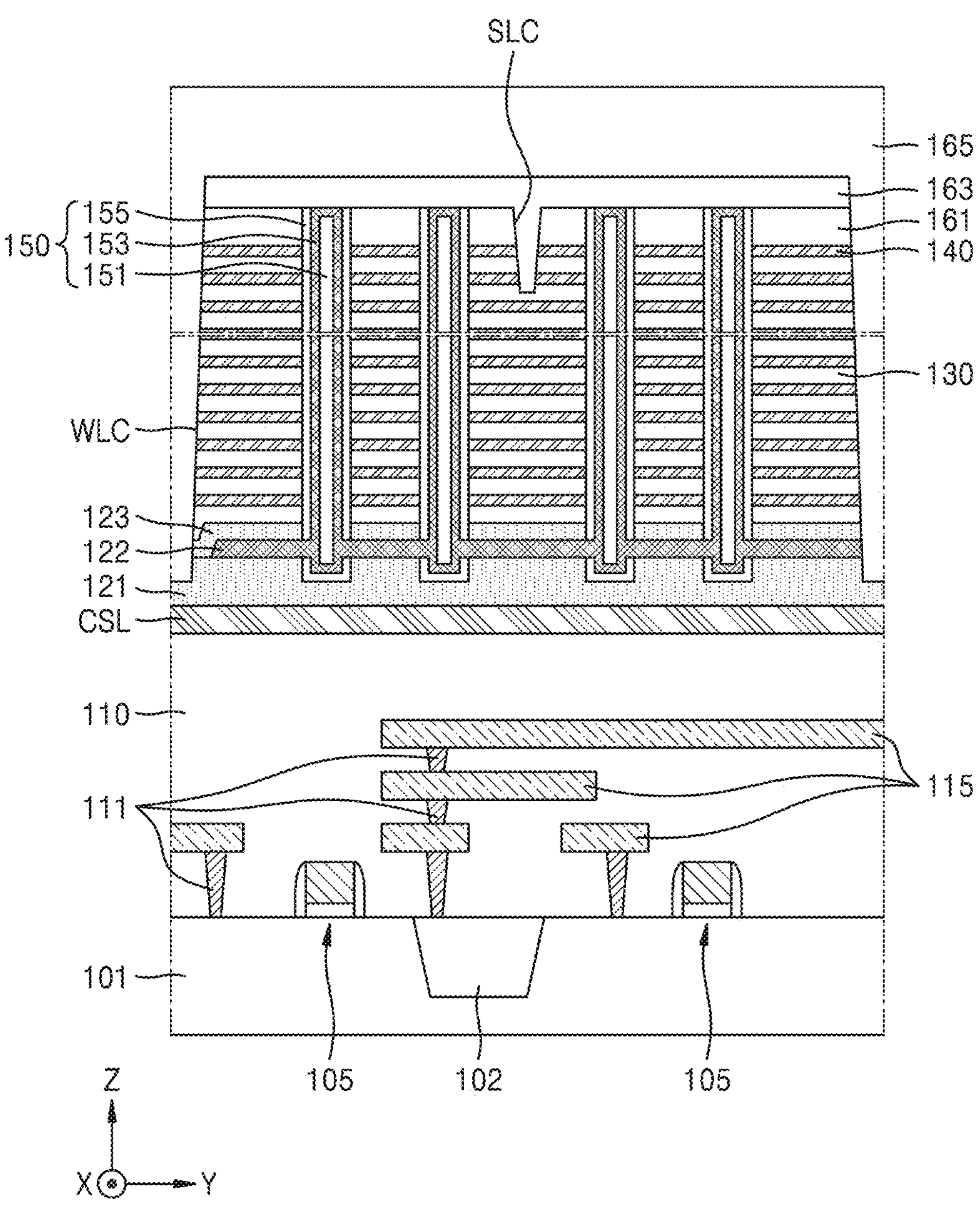

Subsequently, referring to FIG. 18, a third upper insulation layer 165 may be provided.

The third upper insulation layer 165 may fill the word line cuts WLC and cover the top surface of the second upper insulation layer 163. The plurality of gate electrodes 140 at the same level, which are horizontally separated by the third upper insulation layer 165, may be insulated from one another.

Figure 19:
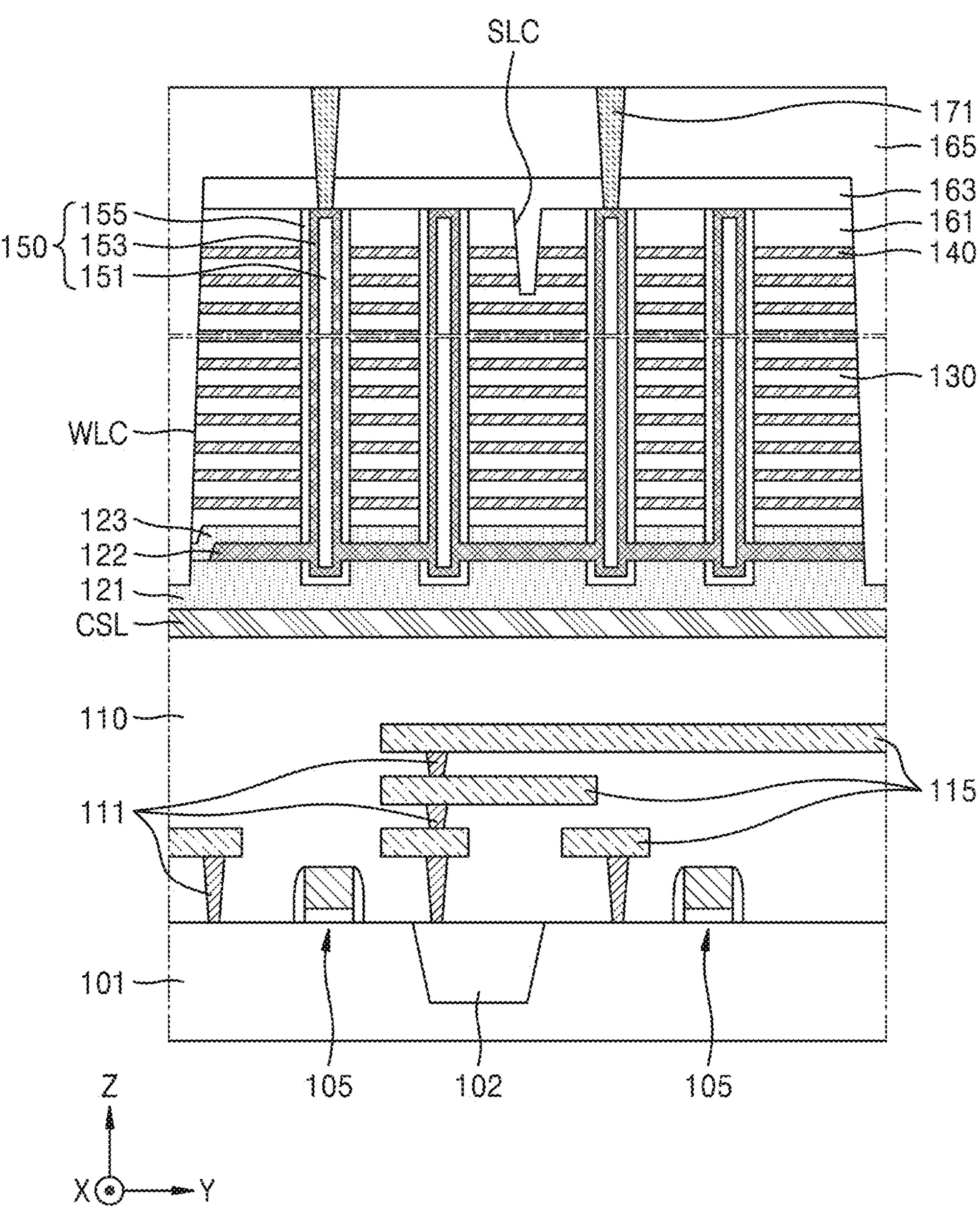

Subsequently, referring to FIG. 19, the bit line contacts 171 may be formed. The bit line contacts 171 may respectively contact the channel structures 150.

After holes for providing the bit line contacts 171 are formed in the channel structures 150 and a conductive material to fill the holes is provided, the conductive material is horizontally separated through a process such as a chemical mechanical polishing (CMP), and thus, the bit line contacts 171 may be formed.

While non-limiting example embodiments of the present disclosure have been particularly shown and described with reference to the drawings, it will be understood that various changes in form and details may be made thereto without departing from the spirit and scope of the present disclosure.

What is claimed is:

1. An inspection method comprising:

inspecting first observation sites by detecting ultrasonic signals emitted from the first observation sites;

inspecting second observation sites by detecting ultrasonic signals emitted from the second observation sites;

inspecting a target structure by detecting an ultrasonic signal emitted from the target structure, the target structure comprising a structure of interest; and obtaining extracted data, which is data regarding the structure of interest of the target structure, based on calculations regarding the detected ultrasonic signals emitted from the first observation sites, the second observation sites, and the target structure, wherein the first observation sites are intermediate results of forming the target structure, respectively, wherein the inspecting of the first observation sites is performed prior to formation of the target structure, and wherein the second observation sites include structures that are different from the target structure.

2. The inspection method of claim 1, wherein the target structure is obtained by performing a series of processes on the first observation sites, respectively.

3. The inspection method of claim 1, wherein each of the second observation sites includes the structure of interest of the target structure, and does not include at least some of elements of the target structure that are adjacent to the structure of interest of the target structure.

4. The inspection method of claim 1, wherein each of the inspecting the first observation sites, the inspecting the second observation sites, and the inspecting the target structure comprises performing at least one from among an optoacoustic inspection and an ultrasonic inspection.

5. The inspection method of claim 1, further comprising pre-processing measurement data regarding the first observation sites, the second observation sites, and the target structure, wherein the pre-processing comprises removing a frequency component of the measurement data regarding the first observation sites, the second observation sites, and the target structure by curve fitting in a time domain.

6. The inspection method of claim 5, further comprising transforming the pre-processed measurement data regarding the first observation sites, the second observation sites, and the target structure by using a Short-Time Fourier Transform (STFT).

7. The inspection method of claim 6, further comprising calculating a medium constructive interference period of the structure of interest, based on a physical model that comprises thicknesses, refractive indices, and attenuation coefficients of material layers constituting the structure of interest.

8. The inspection method of claim 7, further comprising obtaining filtered data regarding the first observation sites, the second observation sites, and the target structure by frequency filtering transformed data, obtained from the transforming the pre-processed measurement data, regarding the first observation sites, the second observation sites, and the target structure based on the medium constructive interference period.

9. The inspection method of claim 8, wherein the obtaining the extracted data comprises obtaining the extracted data based on calculations on the filtered data regarding the first observation sites, the second observation sites, and the target structure.

10. The inspection method of claim 9, wherein the obtaining the extracted data comprises obtaining the extracted data by removing values of pixels of the filtered data regarding the target structure overlapping non-zero pixels of the filtered data regarding the first observation sites and the second observation sites.

11. The inspection method of claim 1, further comprising calculating a medium constructive interference period of the structure of interest, based on a physical model that comprises at least one from among thicknesses, refractive indices, and attenuation coefficients of material layers constituting the structure of interest.

* * * * *